United States Patent
Rempe et al.

(10) Patent No.: US 10,130,916 B1
(45) Date of Patent: Nov. 20, 2018

(54) BIOMIMETIC MEMBRANES AND METHODS OF MAKING BIOMIMETIC MEMBRANES

(71) Applicants: Sandia Corporation, Albuquerque, NM (US); THE REGENTS OF THE UNIVERSITY OF NEW MEXICO, Albuquerque, NM (US)

(72) Inventors: Susan Rempe, Albuquerque, NM (US); C. Jeffrey Brinker, Albuquerque, NM (US); David Michael Rogers, Albuquerque, NM (US); Ying-Bing Jiang, Albuquerque, NM (US); Shaorong Yang, Albuquerque, NM (US)

(73) Assignees: National Technology & Engineering Solutions of Sandia, LLC, Albuquerque, NM (US); The Regents of the University of New Mexico, Albuquerque, NM (US)

( * ) Notice: Subject to any disclaimer, the term of this patent is extended or adjusted under 35 U.S.C. 154(b) by 0 days.

(21) Appl. No.: 15/273,445

(22) Filed: Sep. 22, 2016

Related U.S. Application Data

(62) Division of application No. 13/253,964, filed on Oct. 6, 2011, now Pat. No. 9,486,742.

(Continued)

(51) Int. Cl.
B01D 69/04 (2006.01)
B01D 67/00 (2006.01)
(Continued)

(52) U.S. Cl.
CPC ............ B01D 71/02 (2013.01); B01D 63/066 (2013.01); B01D 69/105 (2013.01); C23C 16/02 (2013.01);
(Continued)

(58) Field of Classification Search
CPC ........ B01D 69/02; B01D 69/04; B01D 69/12; B01D 69/125; B01D 69/127; B01D 71/02;
(Continued)

(56) References Cited

U.S. PATENT DOCUMENTS

| 6,387,453 B1 | 5/2002 | Brinker et al. |
| 6,536,604 B1 | 3/2003 | Brinker et al. |

(Continued)

FOREIGN PATENT DOCUMENTS

JP    2003154223    *  5/2003

OTHER PUBLICATIONS

Cameron et al.; Langmuir 2000, 16, 7435-7444; Atomic Layer Deposition of SiO2 and TiO2 in Alumina Tubular Membranes: Pore Reduction and Effect of Surface Species on Gas Transport.*

(Continued)

Primary Examiner — Pranav N Patel
(74) Attorney, Agent, or Firm — Daniel J. Jenkins

(57) ABSTRACT

The present disclosure is directed to biomimetic membranes and methods of manufacturing such membranes that include structural features that mimic the structures of cellular membrane channels and produce membrane designs capable of high selectivity and high permeability or absorptivity. The membrane structure, material and chemistry can be selected to perform liquid separations, gas separation and capture, ion transport and adsorption for a variety of applications.

11 Claims, 16 Drawing Sheets

Related U.S. Application Data

(60) Provisional application No. 61/390,041, filed on Oct. 5, 2010, provisional application No. 61/466,634, filed on Mar. 23, 2011.

(51) Int. Cl.

| | |
|---|---|
| *B01D 71/02* | (2006.01) |
| *B01D 63/06* | (2006.01) |
| *B01D 69/10* | (2006.01) |
| *C23C 16/02* | (2006.01) |
| *C23C 16/04* | (2006.01) |
| *C23C 16/455* | (2006.01) |

(52) U.S. Cl.
CPC ........ *C23C 16/04* (2013.01); *C23C 16/45555* (2013.01); *B01D 2323/283* (2013.01); *B01D 2325/02* (2013.01)

(58) Field of Classification Search
CPC .. B01D 71/024; B01D 71/025; B01D 71/027; B01D 2325/02; B01D 2325/021; B01D 2325/027
See application file for complete search history.

(56) References Cited

U.S. PATENT DOCUMENTS

| | | | |
|---|---|---|---|
| 6,913,832 B2 | 7/2005 | Fan et al. | |
| 7,947,579 B2 | 5/2011 | Jiang et al. | |
| 2007/0190777 A1* | 8/2007 | Jiang | A61K 31/167 438/633 |
| 2009/0110873 A1* | 4/2009 | Jiang | B01D 46/2418 428/116 |
| 2010/0178468 A1* | 7/2010 | Jiang | B01D 67/0002 428/164 |
| 2010/0178481 A1* | 7/2010 | George | C23C 16/402 428/213 |

OTHER PUBLICATIONS

English language machine translation of JP2003154223, 52 Pages, No Date.*
Hayashi et al., Journal of Membrane Science 124 (1997) 243-251.*
S. Rempe, et al., Computational and Experimental Platform for Understanding and Optimizing Water Flux and Salt Rejection in Nanoporous Membranes, Sandia Report, SAND2010-6735, Sep. 2010.
S. Rempe, et al., Biomimetic Membranes for Water Purification, Sandia National Laboratories R&D 100, 2011 Entry Submission.
T. Humplik, et al., Nanostructured Materials for Water Desalination, Nanotechnology vol. 22 (2011), 292001, pp. 1-19.
Y-8. Jiang, et al., Sub-10 nm Thick Microporous Membranes Made by Plasma-Defined Atomic Layer Deposition of a Bridged Silsesquioxane Precursor, J. Am. Chem. Soc., 2007, 129, pp. 15446-15447.
J. Lee, et al., Recent Progress in the Synthesis of Porous Carbon Materials, Advanced Materials 2006, 18, pp. 2073-2094.
S. Moghaddam, et al., An Inorganic-Organic Proton Exchange Membrane for Fuel Cells with a Controlled Nanoscale Pore Structure, Nature Nanotechnology, vol. 5, Mar. 2010, pp. 230-236.
G: Xomeritakis, et al., Microporous Sol-Gel Derived Aminosilicate Membrane for Enhanced Carbon Dioxide Separation, Separation Purification Technology 42 (2005), pp. 249-257.
Z. Chen et al., DNA Translocation through an Array of Kinked Nanopores, Nature Materials, vol. 9, Aug. 2010, pp. 667-675.
S. Rempe, et al., Computational and Experimental Platform for Understanding and Optimizing Water Flux and Salt Rejection in Nanoporous Membranes, Sandia Report, SAND2010-6735, Feb. 8, 2008.

* cited by examiner

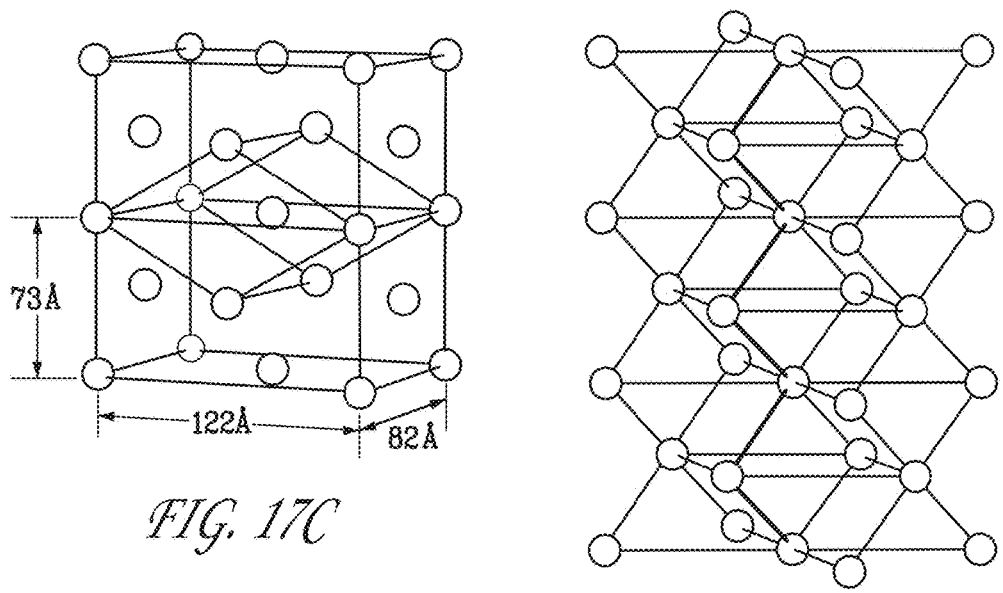
FIG. 17C
FIG. 17D
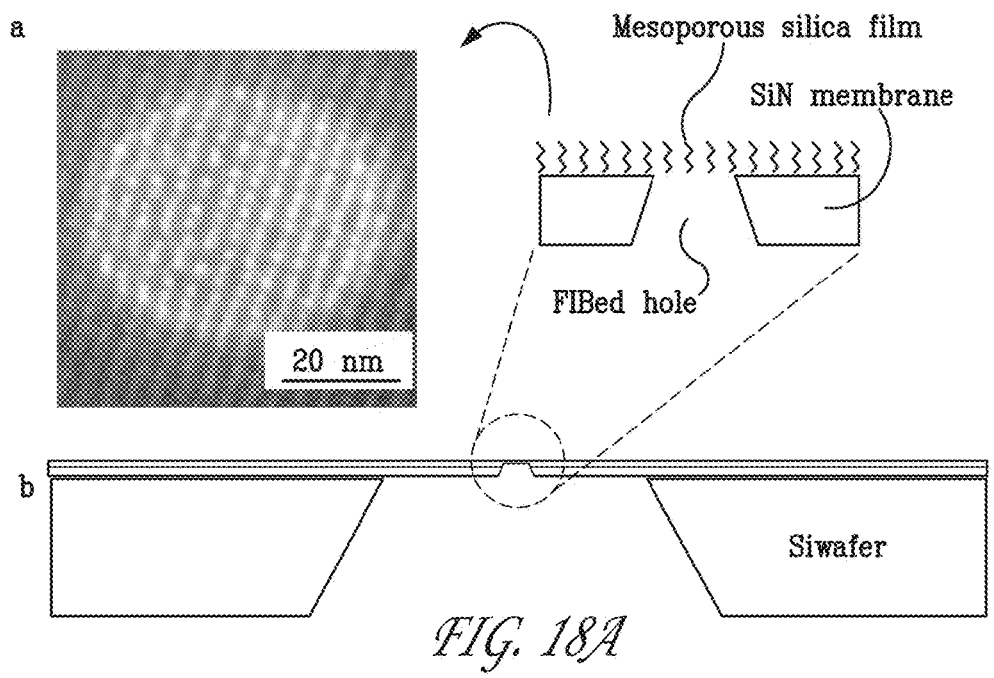
FIG. 18A

| | Refractive index | Pore volume fraction | Volume fraction of TiO$_2$ | TiO$_2$ thickness (Å) | σ (Å) |
|---|---|---|---|---|---|
| Before ALD | 1.260 | 0.42 | — | | |
| 1 Layer TiO$_2$ ALD | 1.305 | 0.37 | 0.05 | 1.7 | 3.4 |
| 2 Layer TiO$_2$ ALD | 1.350 | 0.33 | 0.09 | 3.2 | 6.4 |

BIOMIMETIC MEMBRANES AND METHODS OF MAKING BIOMIMETIC MEMBRANES

RELATED APPLICATIONS

This application is a Divisional of U.S. patent application Ser. No. 13/253,964 entitled BIOMIMETIC MEMBRANES AND METHODS OF MAKING BIOMIMETIC MEMBRANES and filed on Oct. 5, 2011, which Claims priority to U.S. provisional patent application Nos. 61/390,041, filed Oct. 5, 2010, entitled BIOMIMETIC MEMBRANES FOR WATER DESALINATION and 61/466,634, filed Mar. 23, 2011, entitled BIOMIMETIC MEMBRANES FOR WATER DESALINATION, both to which priority is claimed and whose disclosures are incorporated herein by reference in entireties.

STATEMENT OF GOVERNMENT INTEREST

The United States Government has rights in this invention pursuant to Contract No. DE-AC04-94AL85000 between the United States Department of Energy and Sandia Corporation, for the operation of the Sandia National Laboratories.

FIELD OF THE INVENTION

This invention relates generally to membranes, and more particularly to porous membranes having controlled nanopore architecture and a controlled chemistry formed by an ALD/MLD process.

BACKGROUND

Traditional membranes are used in a wide variety of liquid and gas separation and ion transport technologies. In many circumstances, these membranes lack pore uniformity and robustness under operating conditions that can lead to a decrease in performance. Traditional membranes overcome these limitations by using thick membrane materials that impede transport and/or selective permeation that result in decreased performance and increased operating costs.

In one area of traditional polymeric membrane technology, relevant to separating solvents from dissolved salts, the active-site architecture responsible for ion rejection consists of a thick, greater than 100 nm, and compressible polymer coating having non-robust and non-uniform pore architectures. The non-uniformity means that many pores are non-functional. The thickness of the membranes causes resistance to transport. Due to this resistance, the membrane requires high applied pressure to concentrate salty solution on one side of the membrane and force purified solvent to the other side. This thin-film composite membrane design for liquid deionization has remained unchanged for over 30 years.

Considerable research has been undertaken to improve the polymer-based thin-film composites. This research has resulted in incremental progress only, motivating a search for alternative materials demonstrating both high flux and selectivity. Zeolite-based membranes have been considered, but these show high resistance to flow. Membranes composed of stacked, oriented-carbon nanotubes demonstrate high permeabilities around 5.5 cm/hr per bar of applied pressure, more than an order-of-magnitude improvement over thin-film composites, but fail in terms of salt rejection in solutions of relevant ionic strength and are complicated to fabricate.

Several problems existing in the prior art membranes have been solved in cellular membranes. Combined high flux and selectivity of cellular membranes is achieved by membrane-bound ion and molecular channels, whose pore size and chemistry is defined with sub-nanometer precision through protein folding. The thickness of these cellular membranes is limited to that of the cellular membrane bilayer, which is only about 4 nm thick. Functional biological channels are uniform and robust under physiologically relevant operating conditions. However, cellular membranes cannot withstand large pressure differences across the membrane, which are common in the operating conditions of desalination membranes.

FIG. 1 shows an aquaporin channel 100, which is a cellular membrane found in kidney and other cells. Aquaporins allow water transport at fast rates on the order of $10^9$ molecules per pore per second and complete rejection of ions. The active portion of the channel is a thin 2 nm region composed primarily of hydrophobic, aromatic residues (one phenylalanine, and several tryptophan side-chains) and polar groups from the protein backbone that line the open pore permeation pathway. The narrowest segment of the channel has a constriction between 0.3 nm and 0.5 nm in diameter. The open pore architecture is supported and stabilized by the surrounding protein and liquid environment.

What is needed to achieve low resistance, highly selective permeation is a selectively permeable membrane that mimics a cellular membrane, which is porous, reliable, robust, and that can be made thin with uniform small-diameter pores having a desired chemistry. A porous membrane demonstrating these qualities would have numerous applications that would benefit from reduced operation costs and improved performance.

SUMMARY

The present disclosure is directed to a porous membrane that has a tuned nanochannel architecture and chemistry for selective, low resistance permeability and/or adsorptivity.

In an embodiment, a membrane is disclosed that includes a support. The support includes at least one pore having a pore length. The at least one pore is further limited by either the at least one pore having a first pore diameter from a pore opening to a first pore depth and a second pore diameter from the first pore depth to the pore length, the first pore diameter reduced from the second pore diameter by atomic layer deposition or molecular layer deposition of a material; or the at least one pore has a first pore chemistry from the pore opening to a first pore depth, and a second surface chemistry from the first pore depth to the pore length, and wherein the first pore chemistry is formed by atomic layer deposition.

In another embodiment, a membrane is disclosed that includes a nanoporous structure including at least one nanopore having a nanopore diameter of less than about 100 nm and a nanopore length, a coating deposited upon the nanoporous structure that reduces the nanopore diameter to a second nanopore diameter less than the first nanopore diameter for a portion of the pore length less than the pore length, and a polymer film coating the nanopore, the polymer film having a thickness of less than 100 nm.

In another embodiment, a method of making a membrane is disclosed that includes providing a support comprising at least one pore having a pore diameter, and using an atomic layer deposition process or a molecular layer deposition process to deposit a material or deposition to reduce the pore diameter.

In another embodiment, a method of making a membrane is disclosed that includes providing a support including at least one pore having an inside pore surface having a surface chemistry, using an atomic layer deposition process or a molecular layer deposition process, or a molecular layer deposition process to modify a portion of the inside pore surface with an alternate chemistry.

BRIEF DESCRIPTION OF THE DRAWINGS

The accompanying drawings, which are hereby incorporated into the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 17C shows two unit cells from an Fmmm phase, showing the unit-cell dimensions determined from the fit to the GISAXS data shown in FIG. 17A as well as the relationship of Fmmm to the "distorted" Im3m unit cell (shown as the rhomboid).

FIG. 17D shows a schematic of the [0001]-oriented Fmmm phase, showing lattice points (here representing the positions of the pores) in alternate planes. The shortest kinked pathway is shown by the dark vertical kinked line.

FIG. 18A shows a TEM plan-view of a free-standing Fmmm film suspended over a sub-100 nm diameter aperture formed by FIB. The orientation is along [001]. Also shown is a schematic of an experimental platform showing the free-standing film suspended over an aperture formed in a silicon nitride window by FIB. Nanopores are tortuous in the direction normal to the film surface.

An applied voltage of 200 mV was used for all experiments shown in FIGS. 20A-20D, events with a duration longer than 10 ms were also observed but not shown.

Figure 21A:
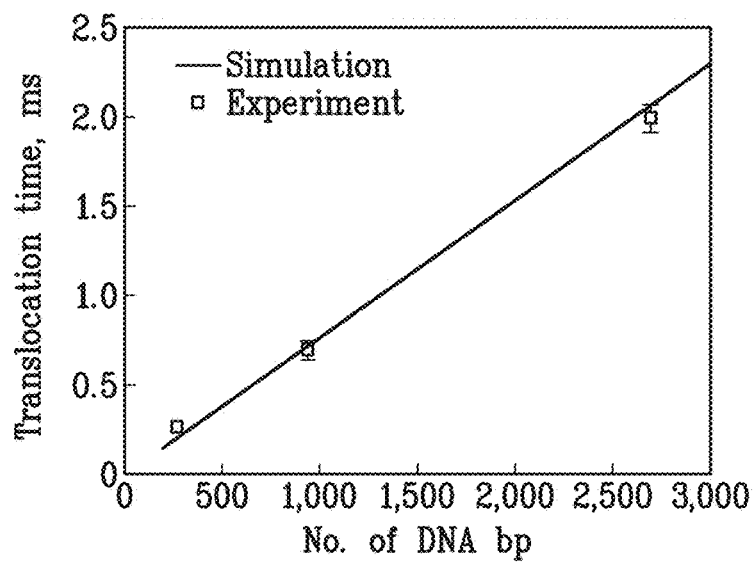

FIG. 21A shows the dependence of translocation time of dsDNA on size (270 bp, 950 bp and 2.7 kbp).

Figure 21B:
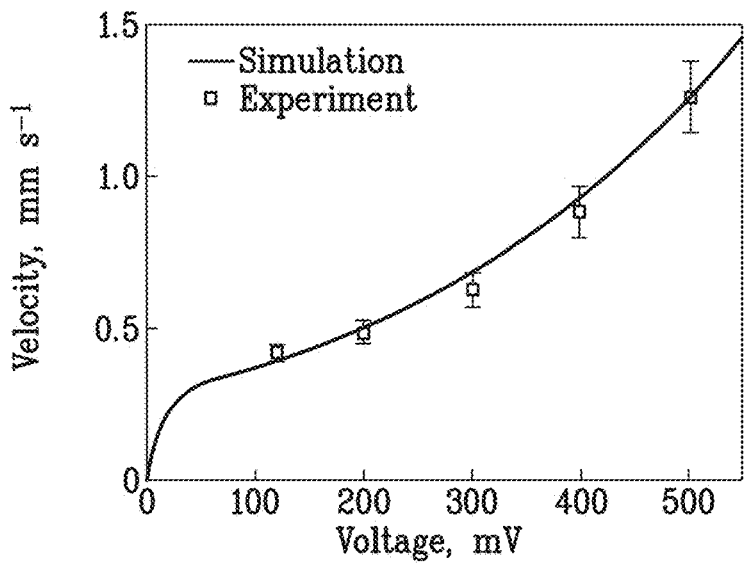

FIG. 21B shows translocation velocity as a function of applied voltage for 950-bp dsDNA. The error bars denote standard deviation evaluated from dwell-time histograms. Simulated data are based on a one-time dimensional drift-diffusion model.

Figure 22A:
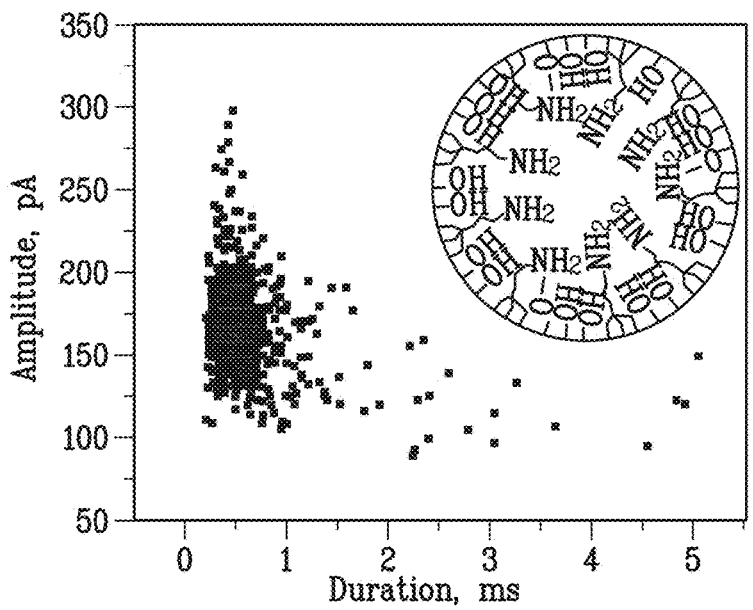

FIG. 22A shows the event diagram of poly(dA)$_{100}$, given –400 mV on the cis side. The insert shows the hypothetical schematic of the pore cross-section after successive ALD half-cycles of APTMS and water.

Figure 22B:
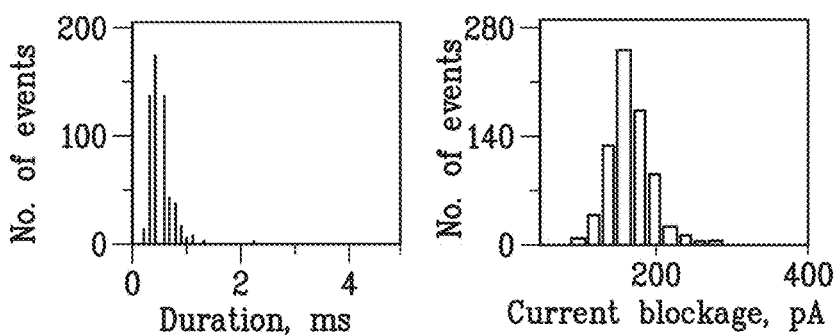

FIG. 22B shows the duration-blockage histogram and the current-blockage histogram of the data of FIG. 22A.

Figure 22C:
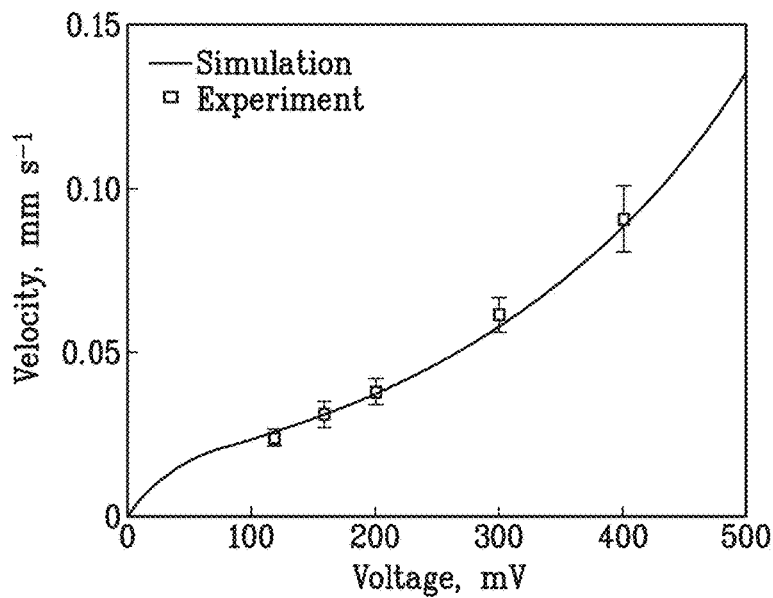

FIG. 22C shows the poly(dA)$_{100}$ translocation velocity as a function of applied voltage for the APTMS-modified pore.

DETAILED DESCRIPTION

Our analysis shows that the cellular protein channels that catalyze pure water transport lack binding sites for ions, but still contain hydrophilic functional groups that form 'binding sites' that stabilize water as well as greasy hydrophobic functional groups that avoid trapping water or ions. Overall the channel provides a thin water conduction pathway of only about 4 nm in length with pore diameter near the size of the permeating molecule, ranging between 0.3 nm and 0.5 nm.

Understanding and harnessing these biomimetic principles has led to the present disclosure directed to robust solid-state membranes. In contrast to the traditional design of membranes for nano-filtration and reverse osmosis applications, the present disclosure is directed to a stable, patterned, and oriented porous architecture. The disclosed nanoporous membrane design mimics cell membranes that contain nano-channels oriented in the membrane-spanning direction and composed of proteins that catalyze higher water flux than conventional reverse osmosis (RO) membrane technology and perfect ion rejection, all at small driving pressures. These membranes have high flux and selective permeability for liquids, gases, cations or anions, as well as adsorptivity for ions and gases.

The present disclosure is directed to porous membranes that are selectively permeable, wherein selectively permeable means the membrane selectively repels, passes and/or traps gasses, liquids and/or specific components of gas mixtures and liquid solutions. Individual pores in the porous membranes have nearly uniform and constant pore architecture that provides uniform functionality. The pores of the membrane can be made thin to shorten diffusion lengths across the membrane and the pores can have a small diameter to reject larger molecules and shorten diffusion lengths to the interior pore walls.

The present membranes may be applied to a wide variety of commercial membrane applications. The applications may be categorized into liquid and gas separation. Separation of liquids and gases or specific components in a liquid solution or gas mixture can occur by rejection, permeation, or trapping.

In liquid separation, a membrane is formed having a pore diameter and chemistry tuned to separate specific components in a liquid, or to be permeable or non-permeable to a liquid solution. In liquid separation, the membrane length and pore width may also be tuned to shorten diffusion distances across the membrane or to shorten diffusion distances to the interior pore walls. The membrane may be tuned to be permeable to a single solvent component in a mixture or be tuned to reject a single solvent component from others in a liquid mixture. For liquid separation, the membrane may be tuned to separate solvent molecules from the dissolved solutes, including electrolytes and molecular ions. The membrane may be tuned to transport the solvent molecules and reject the solutes. The membrane may be tuned to transport solute molecules, including electrolytes, and reject solvent molecules. The membrane may be tuned to separate solutes in the solution. For example, the membrane may be tuned to transport specific solute molecules, such as dissolved ions. The membrane may be tuned to transport several components of the solution, such as cations or anions, or specific molecules in solution such as single-stranded DNA molecules. The tunable chemistry and architecture of the present invention allows the porous membranes to be constructed to transport specific solution components across the membrane, and on or off the pore walls, with high permeability and low resistance.

Applications for liquid separation include, but are not limited to liquid purification by reverse or forward osmosis, power generation by forward osmosis; liquid purification by dialysis; liquid purification by electrodeionization, power generation by reversed electrodeionization; liquid purification by capacitive deionization, power generation by capacitive energy storage; molecule separation, trapping, and modification (e.g. DNA), and power generation by electrochemical transduction in fuel cells.

In gas separation, a gas can be separated from a liquid or specific components of a gas mixture can be separated by rejection, permeation, and trapping. In gas separation, a membrane is formed having a membrane pore structure and chemistry tuned to separate specific components of the gas mixture, or to be permeable or non-permeable to a gas mixture. The membrane pore diameter may be tuned to be permeable to gas molecules not larger than the pore diameter. The membrane pore length may be tuned to minimize gas diffusion distances to enhance permeation rates. This form of separation by size can be termed molecular sieving. In another form of gas separation, a membrane pore architecture and chemistry may be tuned to separate a specific gas component in a mixture by size and chemistry. For example, a membrane pore may be tuned with a hydrophilic pore chemistry and a pore diameter at least as large as the diameter of a carbon dioxide molecule to separate $CO_2$ from a mixture by selective permeation. In another example, a membrane pore may be tuned with a polymer film containing a film pore diameter at least as large as the diameter of a bicarbonate ion and contain a hydrophilic chemistry to separate $CO_2$ by trapping the gas as dissolved bicarbonate ion. Applications for gas separation include, but are not limited to gas purification, capture, and separation.

In an embodiment, a membrane may include a nanoporous material with uniform pore size formed by an evaporation-induced self-assembly process. The pore architecture and chemistry of the nanoporous material may be further tuned so as to mimic the architecture and chemistry of a biological analogue, thereby achieving the selective chemical and permeation properties that are possessed by its biological analogue.

The present disclosure is also directed to a synthetic manufacturing process including ALD/MLD that permits fabrication of highly uniform and robust nanoporous membranes with tailor-made pore geometries and interior pore surface chemistry. Molecular layer deposition (MLD) refers to an ALD process wherein large, organic or organic-inorganic hybrid reactants are used, and the building blocks of the deposition are organic or organic-inorganic molecules. Multi-scale modeling based on quantum descriptions of atomic interactions permit accurate assessments of pore structure versus function relationships. Thus, combined experimental and multi-scale modeling can determine how structure correlates with function in nanopores, which then can be used to guide design and synthesis of membranes for specific applications.

The present disclosure is directed to biomimetic membranes and methods of manufacturing such membranes that include structural features that mimic the structures of cellular channels and produce membrane designs capable of high selectivity and high permeability or adsorptivity. The membrane structure, material and chemistry can be selected to perform liquid separations, gas separation and capture, ion transport and adsorption for a variety of applications.

These applications include, but are not limited to liquid purification by reverse osmosis, forward osmosis, dialysis, electrodeionization, and capacitive deionization; molecule separation, trapping, and modification (e.g. DNA); gas purification, separation and capture; energy storage by supercapacitors; power generation by osmotic forces and fuel cells.

Figure 2:
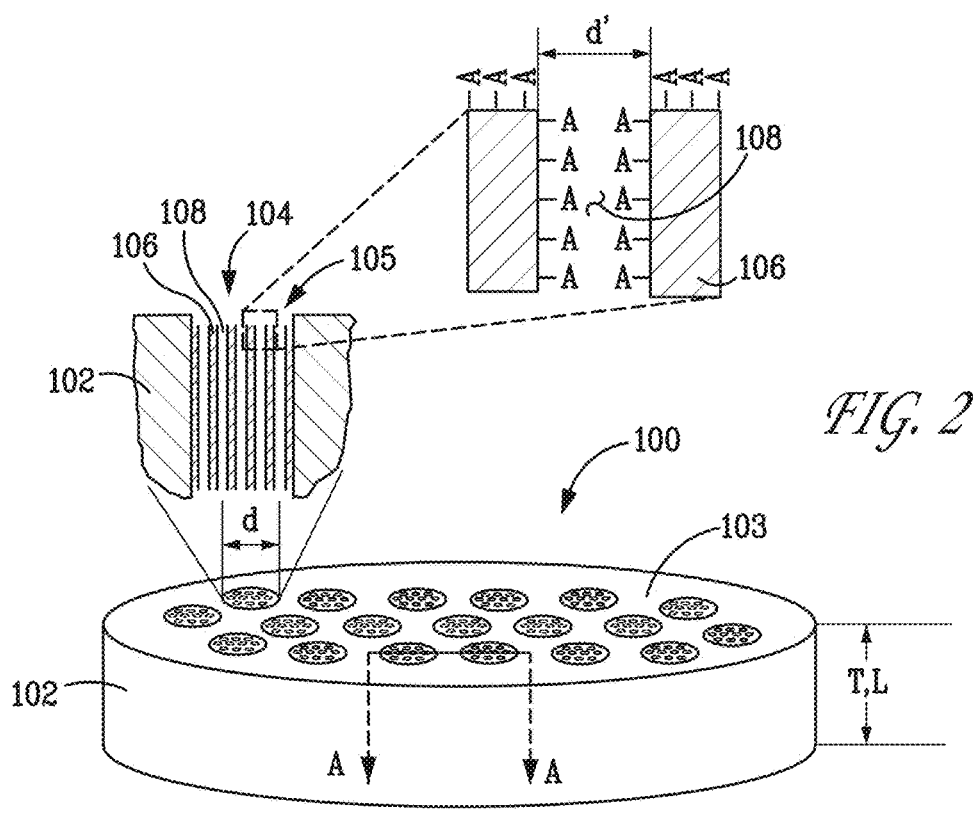
FIG. 2 shows an embodiment of a membrane according to the present disclosure.
Figure 3:
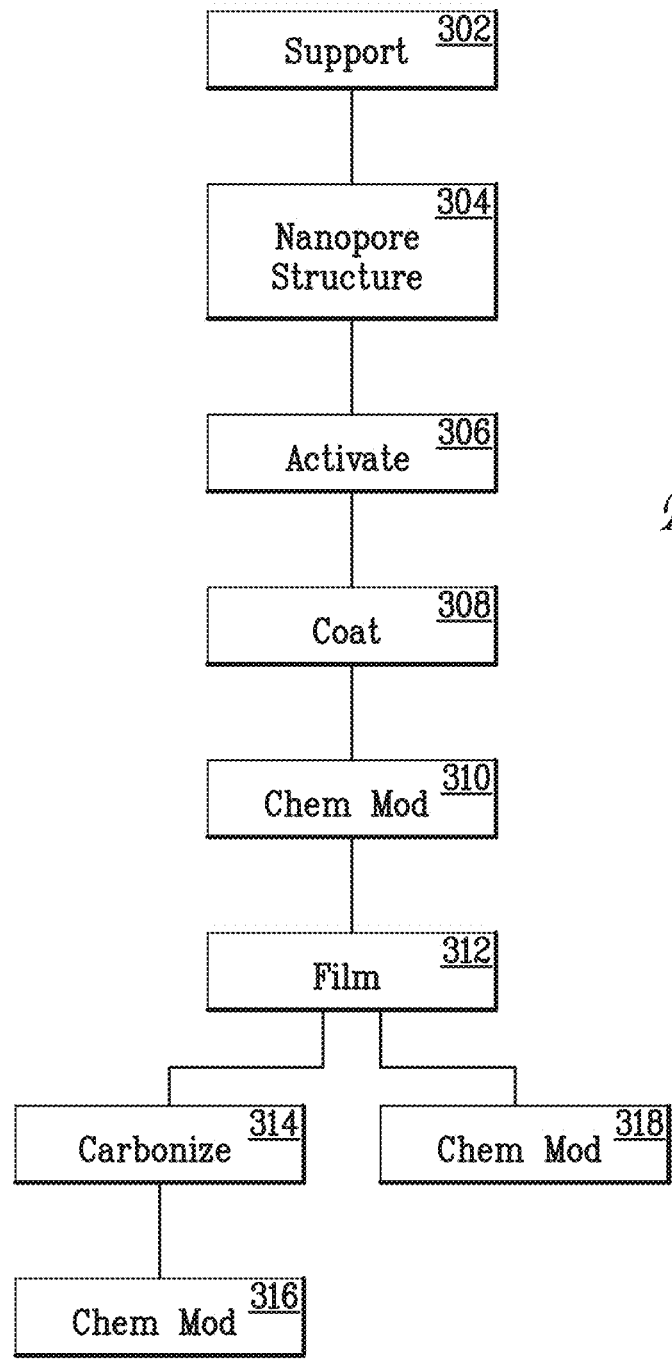
FIG. 3 shows an embodiment of making a membrane according to the present disclosure.

FIG. 2 shows an embodiment of a porous membrane 100 according to the present disclosure. A method of forming a porous membrane according to the present disclosure is generally shown in FIG. 3 and is described in detail below.

According to a first step 302, a porous membrane 100 including a support 102 is provided. The support 102 includes a top surface 103 and pores 104. As used herein, the term pore, nanopore and the like include channel, nanochannel and the like. In this exemplary embodiment, the pores 104 are formed by an electrochemical process. In another embodiment, the support 102 may be a naturally porous material or a non-porous material that is formed to include one or more pores. In another embodiment, the support 102 may be formed having pores of a select porosity and/or may be made porous by a pore forming process, such as, but not limited to, drilling one or more pores by a focused ion beam.

The support 102 may be flexible or rigid. The flexibility of the support 102 may be provided by the material, such as a flexible polymer, or by the structure of the support, such as a thin, flexible metal. In an embodiment, a flexible support may be used in a membrane for reverse osmosis electrolyte applications.

In this exemplary embodiment, the support 102 is formed of anodized alumina. In another embodiment, the support 102 may be made of a material selected from a group including polymers, ceramics, cermets, metals, alloys, glass, carbon, metal organic framework, and/or any combination thereof. In another embodiment, the support 102 may be formed of a polymer selected from a group including porous polysulfone, polyamide, and polycarbonate. In another embodiment, the support 102 may be formed of a ceramic selected from the group including alumina, zirconia, titania, and silicon nitride. In an embodiment, the support 102 may include layers, sections and/or portions of different materials.

The pores 104 pass through the thickness T of the support. In this embodiment, the pores 104 have a substantially circular cross-section and pore diameter d. As such, the thickness T of the support 102 is approximately the same or equal to the pore length L. In another embodiment, the pores 104 may have a non-circular cross-section, such as, but not limited to square and hexagonal. In another embodiment, the pores 104 may have a cross-section that may not be constant over the length L of the pore 104.

In this exemplary embodiment, a plurality of pores 104 occupies the top surface 103. In another embodiment, one or more pores may occupy the top surface 103. In another embodiment, a single pore 104 may occupy the top surface 103. The pores may be uniformly or randomly distributed over the top surface 103. In this embodiment, the pores 104 occupy between about 30% to about 95% of the area on the top surface 103. In another embodiment, a plurality of pores 104 may occupy greater than about 40% of the top surface 103. In an embodiment for gas and ion trapping, a plurality of pores 104 may be used to increase storage capacity. In another embodiment, the plurality of pores 104 may occupy up to about 99% of the area on the top surface 103. In an embodiment for solvent, molecule, and electrolyte transport, a plurality of pores 104 may be used to increase permeation. In a solvent, molecule or electrolyte transport membrane embodiment, and the gas and ion trapping membrane embodiment, the plurality of pores may occupy greater than about 40% of the top surface 103 of the support 102.

Figure 4:
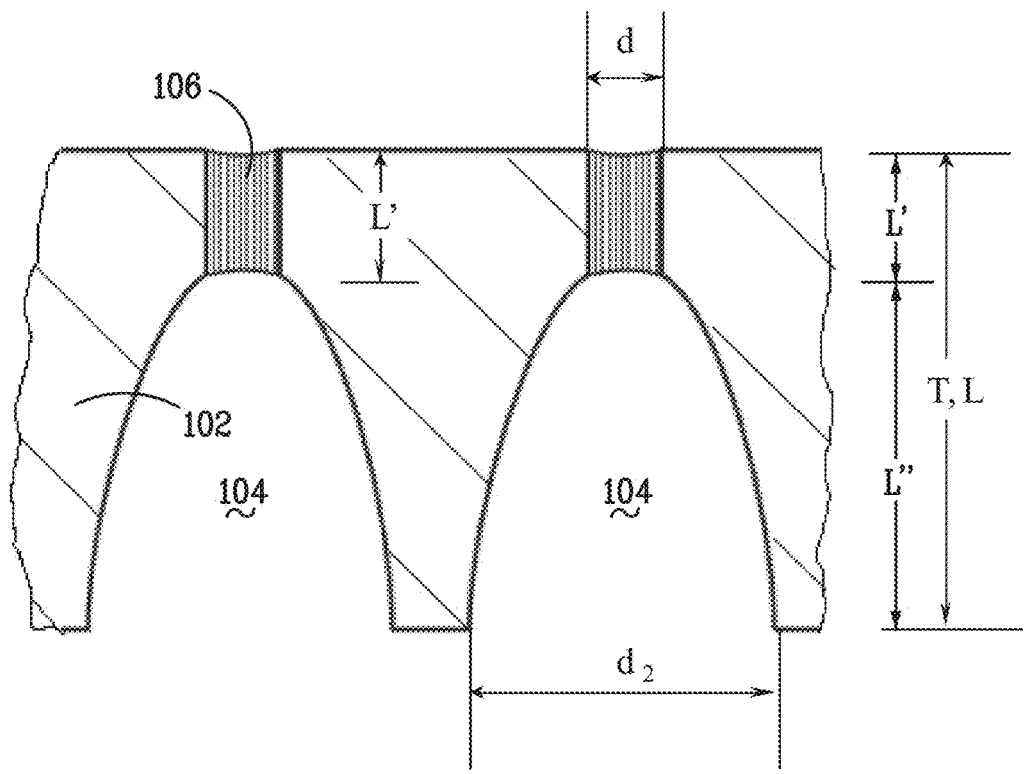
FIG. 4 shows a cross-section of a portion of the support of FIG. 2.

In this exemplary embodiment and referring to FIG. 2 and FIG. 4, the pores 104 have a pore diameter d of about 20 nm at the pore opening 105 and for a first pore length L' of about 2 um. The pore diameter d then increases to a second pore diameter $d_2$ about 100 nm for the remainder of the pore length L". Throughout this disclosure, pore diameter d refers to the average pore diameter located at the top surface 103 of the porous support 102 unless otherwise specified. In another embodiment, the pore diameter d may be substantially constant over the length L of the pore 104. In yet another embodiment, the pore diameter d may vary over the length L of the pore 104.

In another embodiment, the pore diameter d may be less than about 2 mm. In another embodiment, the pore diameter d may be less than about 200 nm. In another embodiment, the pore diameter d may be less than about 100 nm. In another embodiment, the pore diameter d may be less than about 20 nm. In an embodiment of an application for liquid separation, the pore diameter d may be less than 200 nm. Limiting the pore diameter d to less than 200 nm improves the alignment of nanopores of self-assembled material that may be formed in the pores in a later step. Alignment of the nanopores in the membrane-spanning direction may provide less resistance to transport.

In an embodiment for DNA separation, the pore diameter d should be greater than or equal to about 1.5 nm for single-stranded DNA or greater than or equal to about 2 nm for double-stranded DNA. In another embodiment, the pore diameter d should be equal to or greater than about 0.28 nm for water permeation. In another embodiment, the pore diameter d should be equal to or greater than about 0.28 nm for potassium permeation.

In this exemplary embodiment, the support 102 has a thickness T of about 50 um. In another embodiment, the thickness T may be greater than about 10 nm. In another embodiment, the thickness T may be between about 1 um and about 500 um. In another embodiment, the thickness T may be between about 1 um and about 50 um. In another embodiment, the thickness T may be between about 1 um and 10 mm. In another embodiment, the thickness T may be greater than about 10 mm.

In an embodiment, a membrane may be formed from the support followed by further tuning of the pore architecture and/or chemistry as provided by any one or more of the following additional steps.

Figure 1:
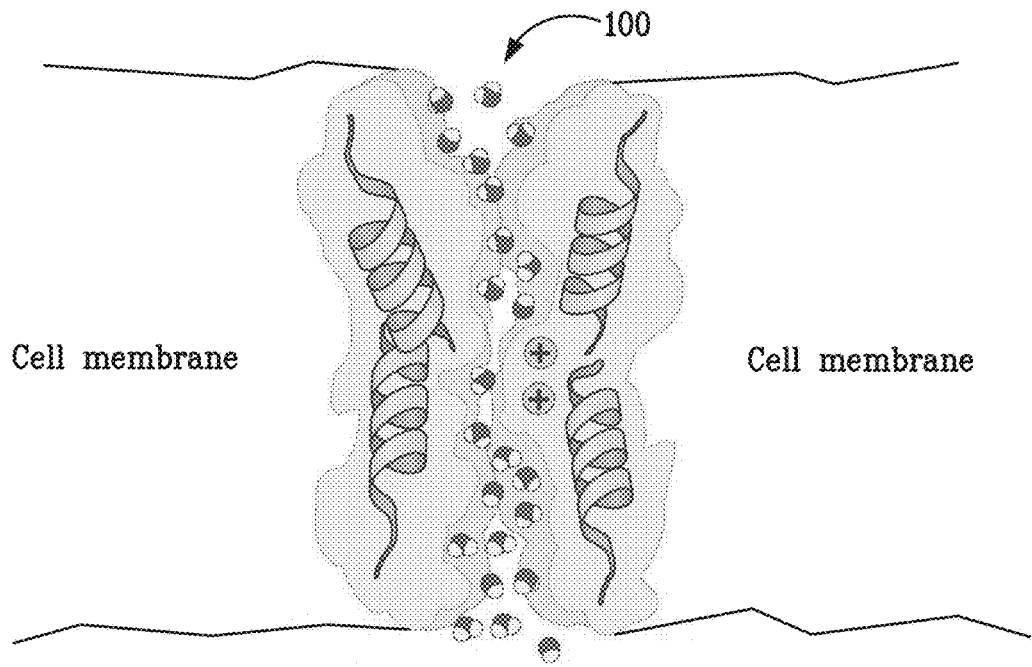
FIG. 1 illustrates an aquaporin channel of a cellular membrane.

Referring again to FIGS. 1 and 2, a nanoporous structure 106 may be formed upon the support 102 in a second step. The nanoporous structure 106 provides a plurality of substantially identical nanopores 108 for the subsequent tuning and chemistry modifications. The nanopore structure 106 is formed by an evaporation-induced self-assembly process. The nanopore structure 106 forms uniform nm-sized pores, providing a plurality of substantially identical nanopores 108 for the subsequent pore tuning and modification steps that define the architecture and chemistry of an active region.

The nanoporous structure 106 is formed of a self-assembled material. The self-assembled material may be selected from a group including self-assembled mesoporous silica, alumina, titania or zirconia, or organic-inorganic hybrid materials, or other nanoporous materials that can be made via an evaporation-induced self-assembly process. In an embodiment, the nanopore structure 106 is formed of a self-assembled material in order to align pores for efficient flux through the nanopores 108. The orientation of the self-assembly process of the self-assembled material may be guided by the orientation of the pores 104 of the support 102, whereby the nanopores 108 in the nanoporous structure 106 have the same orientation as that of the pores 104 of the support 102. In another embodiment, a self-assembled material may be used that forms less aligned nanopores, but the decrease in alignment causes an increase in resistance to flux across the membrane. In an embodiment, the nanopores 108 may be formed with a non-uniform through-pore architecture. For example, to slow transport, the nanopores 108 may be formed with a "kinked" or zig-zag structure.

In this exemplary embodiment, the nanoporous structure 106 is formed of mesoporous silica, which has an active —OH surface chemistry A. In another embodiment, the self-assembled material may have another surface chemistry, which may be active or inert. In another embodiment, the self-assembled material may have a surface chemistry, such as, but not limited to amines, carboxylates, nitrides and nitriles.

FIG. 4 shows a portion of two pores 104 along line A-A of FIG. 2. As can be seen in FIGS. 2 and 4, the nanoporous structure 106 coats and fills the pores 104 of support 102 to a first pore length L' of about 2 um. The first pore length L' may also be referred to as the nanopore length, since the first pore length originates at the top surface 103. In another embodiment, the nanopore structure 106 may fill the length of the pore L of the support or less than the length of the pore L. In another embodiment, the nanopore structure 106 may reach a first pore length L' of between about 10 um and about 100 um. In another embodiment, the nanopore structure 106 may reach a first pore depth L' of less than about 10 um. The nanopore depth L' significantly determines resistance to flow through the nanopore 108, with less nanopore depth L' resulting in less resistance.

In this exemplary embodiment, the nanopores 108 have a nanopore diameter d' of about 2.6 nm. Throughout this disclosure, nanopore diameter d" refers to the average nanopore diameter located at the external surface of the nanoporous structure unless otherwise specified. In another embodiment, the nanopore diameter d' may be less than about 100 nm. In another embodiment, the nanopore diameter d' may be between about 0.3 nm and about 100 nm. In an embodiment, the nanopore diameter d' may be between about 0.5 nm and about 20 nm. In another embodiment, the nanopore diameter d' may be between about 1 nm and about 10 nm. In another embodiment, the nanopore diameter d' may be between about 1 nm and about 5 nm. In another embodiment, the nanopore diameter d' may be between about 2 nm and about 3 nm. In another embodiment, the nanopore diameter d' may be greater than about 2 nm. In another embodiment, the nanopore diameter d' is greater than the molecular diameter of the permeating component.

In an embodiment for DNA separation, the nanopore diameter d' should be greater than or equal to about 1.5 nm for single-stranded DNA or greater than or equal to about 2 nm for double-stranded DNA. In another embodiment, the nanopore diameter d' should be equal to or greater than about 0.28 nm for water permeation. In another embodiment, the nanopore diameter d' should be equal to or greater than about 0.28 nm for potassium permeation.

The nanoporous structure 106 is formed inside the support 102 using an evaporation-induced self-assembly technique. In this exemplary embodiment, the evaporation-induced self-assembly technique included a dip-coating process using a sol-gel solution containing silica precursor and a surfactant, followed by calcination to remove the surfactant. The surfactant is selected to control the nanopore diameter and achieve a uniform nanopore diameter d'. The surfactant functions as a template to control the nanopore diameter d'. In this exemplary embodiment, the surfactant was Brij® 56, which is a polyethylene glycol hexadecyl ether produced by Unigemia Americas LLC. In another embodiment, other surfactants may be used to obtain various nanopore diameters d' and uniformity. In another embodiment, the nanoporous structure 106 may be formed on the porous support by another coating process, such as, but not limited to spin-coating, cast-coating or aerosol deposition.

Figure 5:
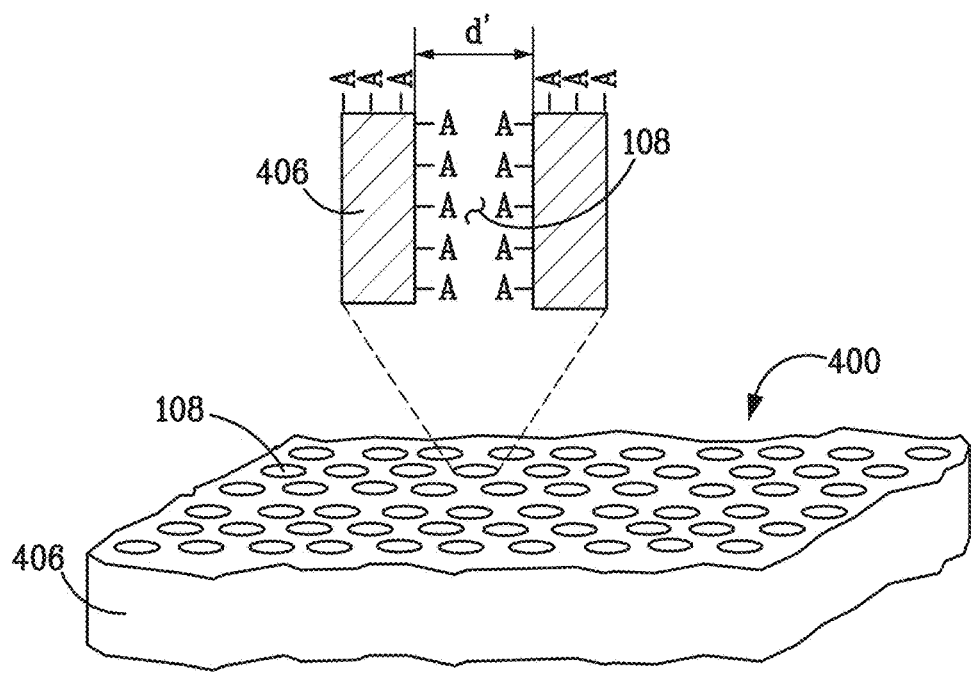
FIG. 5 shows another embodiment of a membrane according to the present disclosure.

In another embodiment shown in FIG. 5, a membrane 400 is disclosed that does not include a support 102 but includes a self-supporting nanopore structure 406. In this embodiment, the nanoporous structure 406 is formed without coating or depositing the nanopore structure material upon a support 102 (FIG. 2). In this exemplary embodiment, the nanopore structure 406 may be formed upon a temporary support, such as a porous or non-porous support (not shown) that is subsequently removed or separated from the nanopore structure 406. In an embodiment, the nanopore structure 406 may be formed upon a physical support, which is subsequently separated from the nanopore structure. In an embodiment, the nanoporous structure 406 may be sol-gel cast upon a support structure and subsequently separated therefrom. In another embodiment, the nanopore structure 408 may be formed upon a temporary support, such as a polymer, glass plate, or ceramic, that is subsequently chemically, mechanically or thermally removed.

The porous membranes 100, 400, with or without the porous support, have a nanoporous structure 106, 406 of select nanopore diameter d' and surface chemistry A. In an embodiment, the porous membranes 100, 400 may be complete after the formation of the nanoporous structure 106, 406. In another application, the porous membrane structure and/or chemistry may be further tuned by altering the structure and chemistry of the membrane, and in particular, of the nanopore structure 100, 400 by one or more of the following additional steps, that are applicable to both porous membranes 100, 400, but which is exemplified by application to porous membrane 100.

Figure 6A:
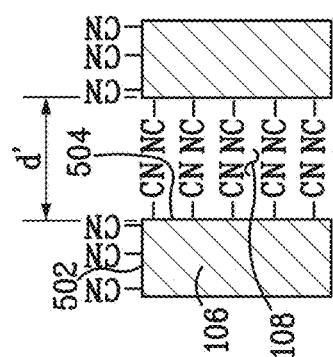
FIG. 6A shows an embodiment of a passivation step according to the present disclosure.
Figure 6B:
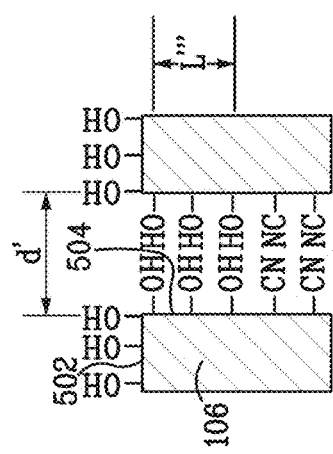
FIG. 6B shows and embodiment of an activation step according to the present disclosure.

A third activation step 306 (FIG. 3) may then be performed. As shown in FIGS. 6A and 6B, the surface chemistry of the nanoporous structure 106 of the porous membrane 100 is activated so as to accept further tuning by reducing the pore size and/or modifying the surface chemistry by ALD/MLD. In another embodiment, the activation step may be performed on the surface chemistry of the pores 104 of the support 102 (FIG. 2).

In this exemplary embodiment, the top surface 502 and the inside pore surface 504 of the pore 108 is activated with an alternate chemistry to a specified pore depth L'''. In this exemplary embodiment, the top and inside pore surfaces 502, 504 are prepared for reactions of subsequent atomic and molecular layer deposition processes (ALD/MLD).

In an embodiment, activation allows for subsequent tuning of the pore 108 to a specified depth L''' by deposition of a coating by ALD as described in further detail in step 4 below. In another embodiment, activation allows for subsequent tuning of the pore 108 to a specified depth by modifying the surface chemistry by ALD or another surface modification technique with an alternate chemistry as described in further detail in step 5 below. In yet another embodiment, activation allows for subsequent deposition of a film 802 (FIG. 9) by MLD to a specified depth L''' as described in further detail in step 6 below.

The first step of activation, as shown in FIG. 6A, is passivating the top and inside pore surfaces 502, 504 of the nanopore structure 106. In this exemplary embodiment, the surfaces 502, 504 are passivated by reacting the surfaces with an organo-silane to form passive, more hydrophobic, —CN (nitrile) surface chemistry. In another embodiment, the surfaces 502, 504 may be passivated by other reactants, for example, by organosilanes $X_{4-x}SiR'_x$, where X can include, but is not limited to Cl, methoxide $CH_3O—$, ethoxide $(C_2H_5O—)$, etc., and R' is an organic ligand, including methyl, ethyl propyl and higher order alkanes as well as all of the reagents referred to generally as silane coupling agents. During passivation, any surface groups that are active to the subsequent ALD/MLD reactions, such as —OH groups that may be present on the nanopore structure 106 after formation, are replaced with the groups that are inert to the subsequent ALD/MLD reactions unless specifically activated. In another embodiment, the passivating groups may be chosen to be inert to other surface chemistry modification techniques. In another embodiment, the passivated group can be chosen to reduce resistance to flow passing through the nanoporous structure 106. In another embodiment, the passivating group can be chosen to balance less resistance to the flow passing through the nanoporous structure 106 with trapping of gases or ions. In another embodiment, the passivating group may be chosen to provide adsorption and/or catalytic functions.

After passivation, the passivated surface is selectively activated as shown in FIG. 6B. In this exemplary embodiment, the top surface 502 is activated, and the inside pore surface 504 is activated to an activation depth L''' of about 5 nm with an alternate active chemistry. In another embodiment, substantially all of the passivated surface is selectively activated. In another embodiment, part of the passivated surface is selectively activated, for example, the passivated surface in the pore entrance vicinity.

The pore activation depth L''' is determined by the membrane application. In this exemplary embodiment, the pore activation depth L''' is about 5 nm. In another embodiment, the pore activation depth L''' may be up to the nanopore length L' (FIG. 3). In another embodiment, the pore activation depth L''' may be less than the nanopore length L'. In another embodiment, the pore activation depth L''' may be up to the nanopore length L'. In another embodiment, pore activation depth L''' may be up to about 20 nm. In another embodiment, pore activation depth L''' may be between about 0.04 nm and about 10 nm. In another embodiment, pore activation depth L''' may be between about 0.1 and about 5 nm. In another embodiment, pore activation depth L''' may be between about 1 nm and about 3 nm.

In this exemplary embodiment, the passivated surface is activated using an $O_2$ plasma treatment including a remote oxygen plasma treatment. Remote $O_2$ plasma is used to limit the depth of activation to a desired pore depth. In another embodiment, plasma or any other short life-time radical formation process may be used. Activation replaces the inert groups, i.e. —CN groups, with groups that are active to subsequent ALD/MLD reactions, i.e. —OH groups, which may be referred to as active chemistry sites or active sites. The subsequent ALD/MLD reactions, which are limited to a depth of the activation by $O_2$ plasma may be referred to as "plasma limited ALD/MLD." In an embodiment, active sites possess a chemistry that is active to subsequent ALD/MLD reactions, thereby allowing ALD/MLD to take place in these sites. In an embodiment, the active sites can be selected from, but are not limited to, amine groups, acid chloride groups, carboxyl groups, hydroxyl groups and sulfonate groups. In another embodiment, activation may be used to replace the passivated surface with surface chemistry groups that provide other functions, such as, but not limited to adsorption, catalytic, or other reactive functions.

In an embodiment, a porous membrane having a select nanopore diameter d' and active surface chemistry is complete after step 3. In another application, the porous membranes structure and/or chemistry may be further tuned by altering the structure and/or chemistry of the membrane, and in particular, of the nanopore structure by one or more of the following additional steps to form a porous membrane.

Figure 7:
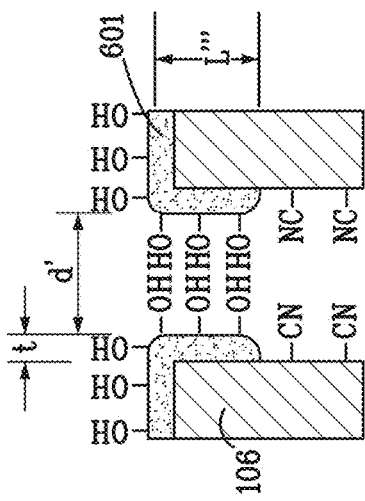
FIG. 7 shows an embodiment of a coating step according to the present disclosure.

A coating step 308 (FIG. 3) may then be performed as a fourth step. As shown in FIG. 7, a coating 601 is deposited on the top surface 502 (FIG. 6B) and inside pore surface 504 of the nanopore structure 106 that has been activated to reduce the nanopore diameter to reduced nanopore diameter d''. In this exemplary embodiment, the coating 601 is applied to the activated surfaces formed after step 3. In such a manner, passivation limits the deposition of the coating 601 to the activated surfaces, or in other words, limits the depth in the nanopore 106 to which the coating deposition occurs.

The coating 601 reduces or narrows the nanopore diameter d' to a reduced nanopore diameter d''. In this exemplary embodiment, the reduced nanopore diameter d'' is about 1.5 nm. In another embodiment, the reduced nanopore diameter d'' may be less than the nanopore diameter d'. In another embodiment, the reduced nanopore diameter d'' may be less than about 100 nm. In another embodiment, the reduced nanopore diameter d'' may be less than about 20 nm. In another embodiment, the reduce nanopore diameter d'' may be less than about 1 nm. In yet another embodiment, the reduce nanopore diameter d'' may be reduced to about 0.2 nm. In another embodiment, the coating step should not be used to form a reduced nanopore diameter d'' less than the diameter of the desired permeating component because then no permeation of that component can occur.

In this exemplary embodiment, the coating 601 reduces the nanopore diameter to the pore coating depth L''' of equal to or less than about 5 nm. In another embodiment, the coating 601 reduces the nanopore diameter d' to a pore coating depth of equal to or less than about 10 nm. In another embodiment, the coating 601 reduces the nanopore diameter d' to a pore coating depth of equal to or less than about 100 nm. In another embodiment, the coating 601 may reduce the nanopore diameter over the entire nanopore length L' (FIG. 4). In another embodiment, the coating 601 may reduce the nanopore diameter d' up to or less than the nanopore length L'. In another embodiment, the coating 601 may be formed at various depths of the nanopore 108 (FIG. 6A). In an embodiment for gas and/or liquid separation, the coating depth L''' may be up to or less than 10 nm so as to reduce resistance to flux.

In this exemplary embodiment, the coating 601 has a thickness t upon the nanopore surface of about 1 nm. The thickness t is controlled by the number of deposition cycles in the ALD/MLD process as described below. In another embodiment, the coating 601 may have a thickness t of between about 0.1 nm and about 100 nm. In another embodiment, the coating 601 may have a thickness t of between about 0.3 nm and about 100 nm. In another embodiment, the thickness t may be less than about 100 nm. In yet another embodiment, the thickness t may be an amount that results in closing the nanopore diameter d' to about 0.2 nm. For example, closing the nanopore diameter d' to about 0.2 nm would allow only small molecules like helium and hydrogen to permeate, but not larger molecules.

In this exemplary embodiment, the coating 601 is formed of silica having an active surface chemistry of —OH functional groups. In another embodiment, the coating 601 may be a metal oxide. The metal oxide may be selected from a group including, but not limited to silica, alumina, titania, zirconia, cerai, vanadia, ruthenium oxide, niobium oxide and manganese oxide having —OH active chemistry. The active surface chemistry may be used to 1) determine the membrane chemistry, or 2) to react with other chemical functional groups (see step 5 below), or 3) used to anchor a polymer film to the membrane (see step 6 below).

In another embodiment, the coating 601 may be formed from the class of materials known as bridged silsequioxanes $(RO)_3S$—$R'$—$Si(OR)_3$ where R is typically an alkyl group and R' and organic ligand including methane ($CH_2$), ethane ($C_2H_4$), phenylene etc. resulting in a hybrid organic-inorganic material. In another embodiment, the coating 601 may be formed of a material having another surface chemistry, such as, but not limited to nitrides.

In an embodiment, the coating 601 may be electrically conducting or semi-conducting. One embodiment of the present invention involves coating the nanopore wall regions with electrically conductive material to form electroactive membranes. Electrically conductive coatings may be selected from a group including, but not limited to carbon, metal oxides, and metals. Carbon may be used by first applying a polymer, which is subsequently carbonized. The metal oxide may be selected from the group including, but not limited to niobium oxide, manganese oxide, or ruthenium oxide. When an electrically conductive coating is used, application of a voltage to the membrane wall material will then attract oppositely charged ions and result in storage of capacitive energy. In this embodiment, the high surface area and low flow resistance afforded by the oriented, porous architecture will lead to higher total capacitance and lower heat generation on switching. In this embodiment, the pores are permeable to electrolyte solution and also tuned to minimize diffusion distances and maximize mass transport of charge to the conductive walls formed by the coating. An electrically conductive coating may be used to provide electrical access to chemical reactions occurring at the membrane surface. This process, termed electrocatalysis, is enhanced by the present invention by increasing the surface area available for reaction and for charge transport through the device, which is a rate-limiting step in present fuel cell technologies.

Furthermore, deposition of thin layers of conductive material can be achieved by ALD/MLD, thus confining the reactions to thin layers to increase reaction cycles. Additional increases in the amount of adsorbed charge may be obtained via subsequent functionalization of the present embodiment with ion-selective polymer.

In this exemplary embodiment, the coating 601 is deposited by an atomic layer deposition/molecular layer deposition method (ALD/MLD). The thickness t of the coating 601 is determined by the number of cycles of the ALD/MLD process. ALD/MLD is used with two or more reactants or optional catalyst(s) to form the deposition, and the reactants are introduced to the sample surface sequentially in a one-at-a-time manner, in a layer-by-layer deposition, introduction of each reactant is followed by a purge or rinse step to remove unreacted reactant and the reaction byproducts.

Figure 8:
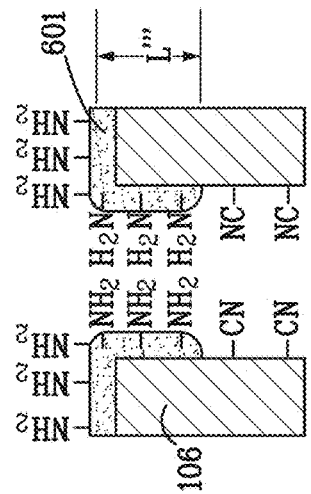
FIG. 8 shows an embodiment of a surface modification step according to the present disclosure.

A fifth chemical modification step 310 (FIG. 3) may then be performed. As shown in FIG. 8, an alternate —$NH_2$ chemistry may replace the active chemistry of step 3 or the active chemistry of the coating 601 formed in step 4. In an embodiment, the alternate active chemistry may be selected from the group including, but not limited to hydroxyl, amines, amide, carboxyls, sulfonates, thiols, polymers, proteins, polyamides, polypeptides, natural peptides and synthetic peptides. In another embodiment, an alternate inert chemistry may be selected from the group including nitrides, nitriles, $CF_3$ or methyl chemistry. In another embodiment, the alternate chemistry may be active or inert. An alternate inert chemistry may be selected to provide a molecular sieving function without chemistry.

The alternate active chemistry may be selected to repel, adsorb and/or transport liquids, gases or the components of liquids or gases. In an embodiment, the liquid component may include an ionic component. In another embodiment, the liquid component may include a solvent and/or dissolved molecule. In another embodiment, the gas component may be a select gas molecule of the gas mixture.

In an embodiment, the alternate active surface chemistry is a functional polymer having a surface chemistry known to select for ions of a specified charge (either anions or cations, but not both). This embodiment has applications in electro-deionization and its reverse process, electricity generation from salt concentration gradients. The embodiment results in a reduction of the energy loss caused by resistance to ion transport.

In an embodiment, a surface chemistry formed by functional polymer groups functionalizes the pore walls to select molecular ions. For example, the polymer surface chemistry, as defined by the polymer functional groups, may be selected to allow passage of DNA with rejection of contaminating protein.

In this exemplary embodiment, the alternate surface chemistry is amine functional sites formed upon the coating 601 to the coating depth L'''. In another embodiment, an alternate surface chemistry may be deposited over the entire nanopore length L' (FIG. 4). In another embodiment, an alternative surface chemistry may be deposited up to a nanopore depth of about 20 nm. In another embodiment, an alternative surface chemistry may be deposited between a nanopore depth of about 0.04 nm and about 10 nm. In another embodiment, an alternative surface chemistry may be deposited between a pore depth of about 0.1 and about 5 nm. In another embodiment, an alternative surface chemistry may be deposited between a pore depth of about 1 nm and about 3 nm. In an embodiment, the depth of changing to the alternate chemistry may be controlled by masking and/or another blocking technique. In another embodiment, one or more types of surface chemistries may be deposited on the pore surface. In another embodiment, one or more types of surface chemistries may be formed at various depths of the nanopore 108 by masking and/or another blocking technique.

In this exemplary embodiment, the alternate active chemistry is formed by ALD. In another embodiment, the alternate active chemistry may be formed by another chemical process, such as liquid chemistry or chemical vapor reaction. In another embodiment, more than one alternative active chemistry may be formed. In an embodiment, one or more active chemistries may be formed by 1) controlling the ALD/MLD process and/or 2) subsequent surface chemistry treatment including chemical, thermal and/or mechanical treatment.

In this embodiment, the alternate chemistry formed by step 5 completely converted the prior active chemistry. In another embodiment, the alternate chemistry formed by step 5 may only partially convert the prior active chemistry. The degree of conversion is controlled by the number of ALD/MLD cycles.

In an embodiment, a porous membrane may be complete after step 5, or the porous membrane may be further modified by ALD/MLD of any one or more of the following steps.

Figure 9:
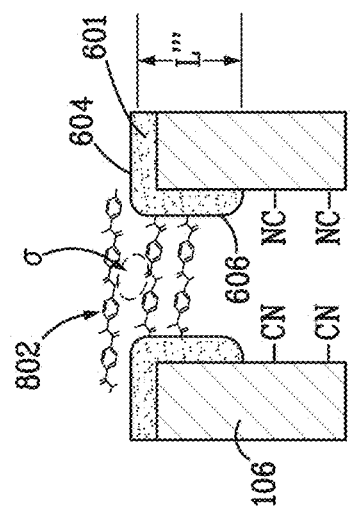
FIG. 9 shows an embodiment of a polymer film formation step according to the present disclosure.
Figure 10:
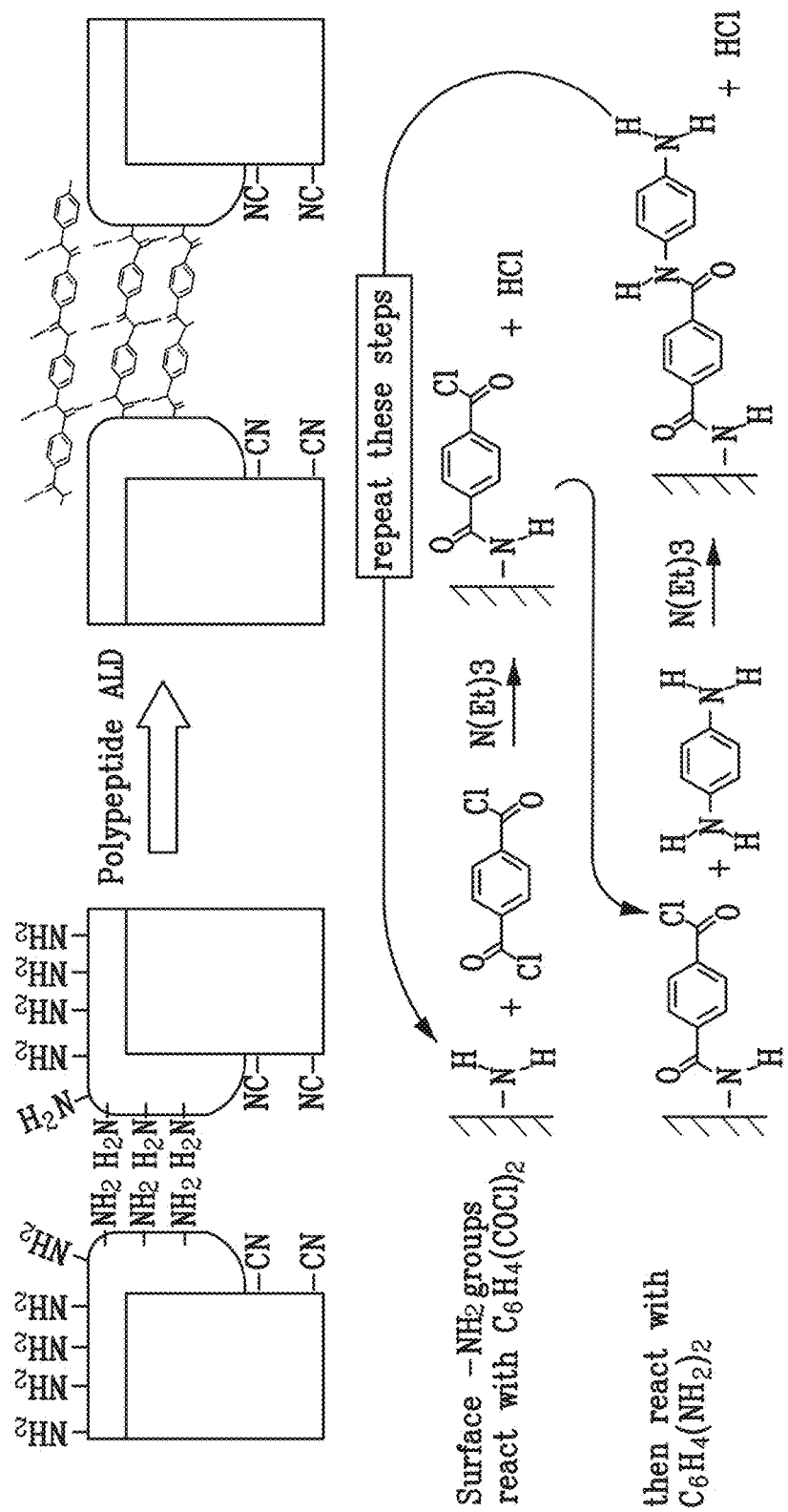
FIG. 10 shows an embodiment of a mechanism of the film formation step.

A film formation step 312 (FIG. 3) may then be performed. As shown in FIG. 9, a polymer film 802 is formed by MLD upon the alternate chemistry formed on the coating 601 (FIG. 7). In this exemplary embodiment, the polymer film 802 is deposited upon the alternate chemistry of the top surface 604 and the inside pore surface 606 of the coating 601. The mechanism of the film formation step 312 is shown in more detail in FIG. 10.

In an embodiment, the polymer film 802 selects ions of a specified charge (either anions or cations, but not both). This embodiment may have applications in electrodeionization and its reverse process, electricity generation from salt concentration gradients.

The polymer film 802 attaches to the coating 601 by covalently bonding to the alternate active chemistry of the coating 601 formed after optional step 5. In another embodiment, the polymer film 802 may be covalently anchored to the active chemistry of the support 102 (FIG. 2), to the active chemistry of the nanoporous structure 106, to the alternate active chemistry of the nanoporous structure formed after optional step 3, or with the active chemistry of the coating 601 (FIG. 7) as originally formed after step 4.

In this exemplary embodiment, the polymer film 802 is a peptide film, attached or anchored to the functional $-NH_2$ sites formed after step 5. Specifically, the peptide film is made of polyamide. The molecular channels in the resulting peptide film have sub-nm diameter pores with exposed $-N-H$, $-C=O$, and hydrophobic aromatic groups that mimic the surface chemistry found in biological water-selective channel proteins.

In another embodiment, the polymer film 802 may be a peptide, protein, polymer and mixture of any combination thereof. In an embodiment, the polymer film 802 may be a polymer selected from the group including polyamides, polycelluloses, polystyrenes, polyarylenes, polycarbonates, polysulfones, polyvinylacetates, polyacrylonitriles, poly(N-isopropylacrylamide), ionomers and elastins.

In an embodiment, the polymer film 802 may be a poly(N-isopropylacrylamide), which may be used to form a membrane for carbon capture. The poly(N-isopropylacrylamide) is a programmable polymer that can change properties with temperature, such as switching from hydrophobic to hydrophilic with temperature. In the hydrophilic state, the polymer may adsorb or capture $CO_2$ in its water soluble form, and in the hydrophobic state, the polymer may release $CO_2$. In another embodiment, the polymer film 802 may be another polymer that switches between hydrophilic and hydrophobic states.

In another embodiment, the polymer film 802 may have an active or inert surface chemistry. In another embodiment, the active surface chemistry may be selected from the group including, but not limited to carboxyl, carbonyl, hydroxyl, amine, aromatic, hydrocarbon, amide, hydrocarbon chains, sulfate, methyl, and thiol. In an embodiment, the polymer film 802 may include alternating hydrophilic (polar or charged) and hydrophobic (aromatic or hydrocarbon) chemistries.

The polymer film 802 has a film pore size a. The film pore size a is determined by the MLD polymerization process for the particular polymer. In this exemplary embodiment, the film pore size a is about 0.28 nm. In an embodiment, the film pore size a may be between about 0.2 nm and about 10 nm. In an embodiment, the film pore size a may be between about 0.2 nm and about 1 nm. In another embodiment, the film pore size a may be between about 0.2 nm and about 0.6 nm.

In this exemplary embodiment, the polymer film 802 is attached to the top surface 604 of the coating 601 and within the nanopore. In another embodiment, the polymer film 802 may be attached to any another active chemistry surface formed by any of the steps described above. In another embodiment, a different polymer film may be attached to any of the active chemistries of any of the active surfaces formed by any of the steps described above.

In this exemplary embodiment, the polymer film 802 fills the nanopores 108 (FIG. 6A) to a depth of about 5 nm. The polymer film 802 is deposited by MLD by initially attaching to the active chemistry and is then further deposited by MLD by polymerizing upon itself. In another embodiment, the polymer film 802 may be deposited to the pore depth of the active chemistry formed by ALD of any of the steps described above.

In this exemplary embodiment, the polymer film 802, and its architecture and chemistry, is selected to reject ions. More generally, the architecture and chemistry of the polymer film is selected to reject or transport select ions or molecules. In an embodiment, the polymer film 802, and its inherent pore size, may be selected to provide a barrier to permeation of molecules or ions of a specified size. In another embodiment, the polymer film 802 may be selected to select for ions of a specified charge (ions or cations, but not both) for transport. In another embodiment, the polymer film 802 may be selected to adsorb molecules, such as $CO_2$.

Anion and cation selective polymer films have applications in but not limited to electrodeionization and its reverse process, which is electricity generation from salt concentration gradients, ion transport in fuel cells, and selective ion transport in liquid purification. In these applications, the polymer film reduces energy loss by decreasing the resistance to ion transport. In a related embodiment, the polymer film may be selected for separation of a solvent from a solution by rejecting dissolved solutes. An example is the exemplary embodiment in which the polymer film is selected to provide water purification.

In an embodiment, a polymer film may be used to provide a barrier in a fuel cell to unfavorable transport of unreacted fuel (dihydrogen, methane, methanol, ethanol, etc.) as well as a mechanism for attracting substrates and removing products with low flow resistance. In another aspect of fuel cell application, the polymer film provides permeability to electrolyte solutions and mass transport of ions such as $H^+$, $Li^+$, and $OH^-$.

The advantage of depositing the polymer by MLD as opposed to traditional film formation approaches is that the polymer film can be made thin, less than 100 nm, to decrease transport distance, and to have uniform pore structure. In addition, the polymer films formed by MLD have a robust structure that resists deformation under applied pressure and temperature.

In an embodiment, a porous membrane is formed after step 6. In another embodiment, the polymer film may be formed by MLD upon the support having an active chemistry or upon any of the further support modification steps 2, 3, 4, 5, 6 that have an active surface chemistry. In another embodiment, a porous membrane of any of the following embodiments that include a polymer film may be further modified by carbonization and/or surface chemistry modification as further described below.

Figure 11:
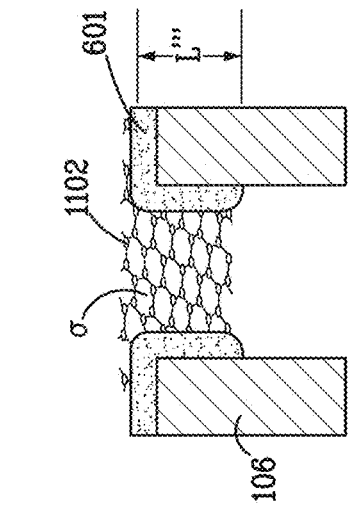
FIG. 11 shows an embodiment of a carbonization step according to the present disclosure.

A film modification step 314 (FIG. 3) may then be performed. As shown in FIG. 11, the polymer film 802 (FIG. 9) is carbonized to form a porous carbon structure 1102. The porous carbon structure 1102 has a carbon structure pore size σ' that approximates the film pore size σ (FIG. 9). In an embodiment, the carbon structure pore size σ' may be between about 0.2 nm and about 50 nm. In another embodiment, the carbon structure pore size σ' may be between about 0.2 nm and about 20 nm. In another embodiment, the carbon structure pore size σ' may be between about 0.2 nm and about 4 nm. In another embodiment, the carbon structure pore size σ' may be between about 0.2 nm and about 1 nm.

The porous carbon structure 1102 may be electrically conductive and chemically adsorptive. In an embodiment, the porous carbon structure 1102 can allow application of a voltage to the membrane wall material that will then attract oppositely charged ions and result in storage of capacitive energy. In such a manner, the membrane may be used as a supercapacitor to store energy. The porous carbon structure 1102 also provides natural adsorptivity by chemical interactions. The uniform and robust pores of the porous carbon structure 1102 formed by a polymer formed by MLD renders substantially all pores accessible to electrolyte solutions, thus facilitating mass transfer of ions onto the conductive carbon material of the porous carbon structure 1102. In other words, the uniformly open pore structure of the porous carbon structure 1102 provides pathways to allow electrolyte transport in addition to a large active surface area.

The porous carbon structure 1102 fills the nanopores 108 (FIG. 6A) to a depth L''' or to the approximate depth of the polymer film 802 (FIG. 9). High porosity in the carbon can be obtained by minimizing the number of ALD/MLD cycles used to lay down a polymer film, which is subsequently carbonized. The high porosity renders the pores more accessible to electrolyte solutions, thus facilitating mass transfer of ions onto the conductive carbon material.

In another embodiment, the support and/or nanopore structure may be removed by a chemical, thermal or mechanical process to provide a free-standing porous carbon structure formed by the carbonization of a polymer film formed by MLD.

An eighth step 316 (FIG. 3) performing a chemical modification may be performed on the carbon structure 1102 (FIG. 11). In this embodiment, the surface chemistry of the porous carbon structure 1102 is modified. The porous carbon structure 1102 may be modified by ALD or another chemical treatment. For example, —OH or carboxyl surface chemistry may be formed upon the porous carbon structure 1102 to facilitate the mass transport of electrolyte to the carbon surface. In another embodiment, any one of the surface chemistries as discussed above may be used to modify the carbon structure 1102.

A ninth step 318 (FIG. 3) of chemical modification may be performed on the polymer film 802 (FIG. 9). In this embodiment, the surface chemistry of the polymer film 802 is modified. The polymer film 802 may be modified by ALD or another chemical treatment. For example, —OH or carboxyl surface chemistry may be formed upon the polymer film 802 to facilitate the mass transport of electrolyte to the polymer surface. In another embodiment, any one of the surface chemistries as discussed above may be used to modify the polymer 802.

An example of a liquid separation membrane is provided below.

EXAMPLE

A pervasive and growing problem afflicting nearly half of the world's population is inadequate access to clean, fresh water. Scarcity of clean water underlies death, disease, and international tension. Furthermore, energy and water are inextricably linked, with the production of one requiring use of the other. For example, vast amounts of water used in mining, drilling, oil and coal refining, biofuels production, and in cooling systems for nuclear and conventional electricity generation drive water use and further stress clean water supplies.

The best current solution to water purification relies on reverse osmosis (RO) membranes that remove salts and larger components from water with applied pressure. A survey by the U.S. National Research Council in 2004 revealed that more than half of the 15,000 desalination plants operating around the world utilize RO technology. In the U.S., RO membranes contribute to 96% of online desalination capacity. Since desalination by reverse osmosis is more efficient than the alternative evaporation technology, nearly all new plants going into production are built on RO technology. Despite its success and widespread use, water desalination by RO is associated with tremendous energy costs. Expensive electrical energy accounts for the largest component of the operating cost for seawater desalination facilities. Using the Perth, desalination plant as an example, more than half the energy budget is used to establish the pressure drop needed to push water through the semipermeable membrane that blocks dissolved salts. This energy requirement is far higher than the minimal thermodynamic cost associated with concentrating salt solutions because current membranes have low permeability to water and thus resist flow. Considering the cost of electricity needed to establish pressure gradients across the RO membrane, membrane resistance to flow carries a price tag of approximately $1.6 M per year for a modestly sized 100 million liter (ML) per day RO facility.

This example is directed to a liquid separation membrane that may be used in a reverse osmosis (RO) process to purify a liquid or a forward osmosis process that can be used to generate power. The membrane may be used in liquids having salt concentrations that may fall in the brackish range of 0.1 g/L-16 g/L. With additional tuning, the membranes may be used for separating solutions with higher salt concentrations. The presently disclosed membrane is able to maintain high salt rejection at low flux rates, providing a breakthrough in this application. In particular, the present membrane can operate at pressures as low as about 5.5 bar and still maintain high salt rejection ratios. Specifically, at these low pressures of around 5.5 bar, the membrane can achieve a 10-fold improvement in membrane permeability to water flow compared to commercial membranes.

If the small-scale membrane were embedded in a large-scale format, the improved performance would translate into a projected savings of 88% of the cost due to the membrane resistance to flow. Given the current cost of electrical energy, this enhancement in membrane performance may make it economically feasible to install brackish water desalination plants to lower the water cost in areas that were not possible to reach using prior technology.

In an embodiment, a desalination membrane is disclosed that includes fabricating a nanoporous material with uniform pore size of 2.6 nm, followed by reducing the diameter of the pore entrance vicinity by a plasma-defined atomic layer deposition process, and modifying the pore surface chemistry so that the pores possess the architectures found in natural aquaporins. These architectures may include: C=O, N—H dipoles, inter-strand H— bonds, short hydrophobic regions within the pore, pore diameters as small as 0.3 nm, and lack of dense arrays of dipoles that could form ion binding sites. The pore architectures are uniform and robust to applied pressures used in desalination. By doing so, high water flux and high salt rejection may be achieved.

According to the present example a porous, uniform and robust biomimetic membrane was formed by the following steps. A support of a 13 mm, anodized alumina disc was provided. The disc had 20 nm through pores that occupied more than 50% of the disc surface area. A nanoporous structure of self-assembled mesoporous silica was coated on the support. The self-assembled mesoporous silica had regular oriented 2.6 nm diameter nanopores.

The nanoporous structure was formed by dissolving 0.90 g of Brij® 56 surfactant in 15 mL ethanol, followed by addition of 2.8 g of tetraethoxysilane (TEOS) and 1.25 mL of 0.07 M HCl aqueous solution. The solution was stirred vigorously for 75 minutes then diluted with ethanol to 65 mL. The anodized alumina discs were then dip-coated using this solution twice, and the dip-coated samples were calcined at 450° C. for 3 hours to remove surfactant.

The nanoporous structure was then passivated to a depth of about 5 nm. It was passivated by reacting with an organo-silane, followed by treatment with remote oxygen plasma to activate the first 5 nm of the pore depth through formation of —OH groups. Functionalization proceeded via deposition of silanes to form a silica coating in the first 5 nm of the nanopores by plasma-assisted ALD. The coating reduced the nanopore diameter to about 1.5 nm.

Figure 12:
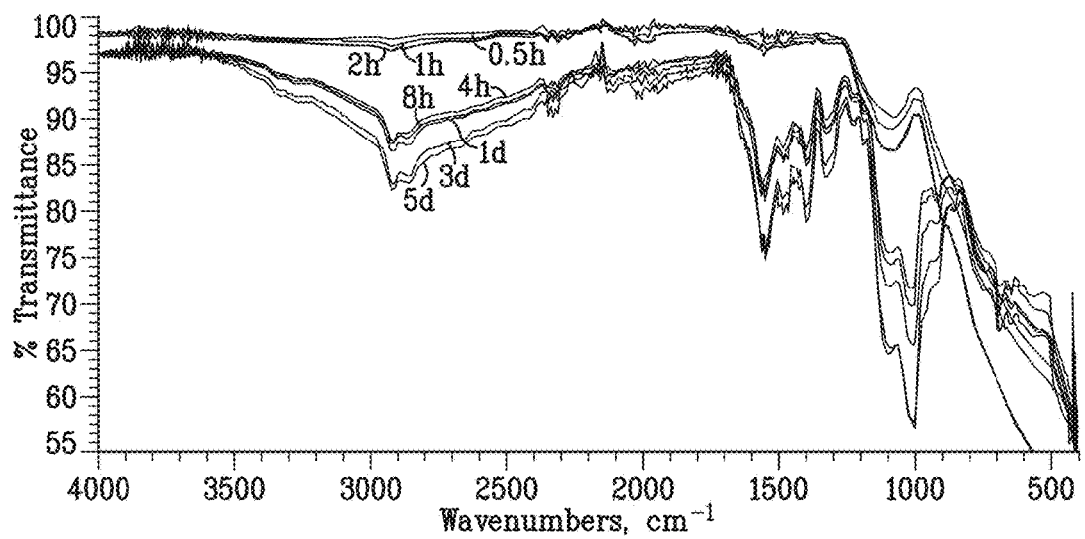
FIG. 12 shows the FTIR spectra for the mesoporous silica samples treated by APS with various reaction times.

In order to provide anchoring functionality for the MLD reactions, amine groups were added to the silica surface in a modification step by immersing samples in a toluene aminopropyl triethylsilicate (APS) (33% w/w) and triethylamine (3% w/w) for 2 hours. The residual APS was removed under vacuum at 100° C., and confirmed with FTIR (FIG. 12).

The pore size and surface chemistry were further tuned using an MLD process using terephthaloyl chloride and parabenzenediamine molecules as precursors and triethylamine as a catalyst. The layer-by-layer deposition of the MLD process formed uniform pores of a specific pore size to the activation depth in the nanopore. The molecular channels in the resulting peptide network had a sub-nm diameter with exposed —N—H, —C=O, and hydrophobic aromatic groups, deliberately designed to mimic the channel chemistry found in cellular water-selective channel proteins.

MLD was carried out at 120° C. in an A-dep MLD system. Terephthaloyl chloride (TC, heated at 120° C.), and parabenzenediamine (PA, heated 120° C.) were used as the precursors and triethylamine (TEA) as a catalyst. Each MLD cycle consisted of the following four steps: 1.) 20 seconds exposure of TC and TEA; 2.) Argon purge at a flow rate of 10 sccm for 10 seconds; 3.) 20 seconds exposure of PA and TEA. 4.) Argon purge at a flow rate of 10 sccm for 10 seconds. These steps were repeated to achieve surface polymer growth, progressively shrinking the film pore diameter.

After the MLD deposition, water permeance and salt rejection properties were measured using a high pressure liquid chromatography (HPLC) water pump, with a constant input feed at 5 g/L NaCl solution and varied imposed membrane pressure drops. In a head-to-head comparison with the FILMTEC™ SW30HR polyamide thin film composite membranes from DOW designed for water desalination, the ALD/MLD membranes outperform the commercial membranes at multiple pressures. At high pressures (300 psi), the MLD membrane produced purified water within drinking water standards, but with four times the water flux compared to the commercial membrane. As pressure decreases, the MLD membrane performs well in both water flux and salt rejection. Because of the nanoporous framework and in contrast to prior polymer coating technology, the MLD membrane still retains a linear flux relationship and nearly constant salt rejection with decreasing pressure, making it able to operate with high efficiency at pressures as low as 80 psi, thus substantially outperforming the commercial membrane.

The salt rejection and membrane flux were characterized for varied surface chemistries and pore sizes. In this example, the salt rejection of porous MLD membranes increases substantially after MLD modification with alternating amine and hydrophobic chemistries. After 32 MLD cycles, these membranes show 85-95% salt rejection and more than triple the water flux of a polyamide thin-film composite (TFC) membrane designed for seawater desalination. In addition, the MLD membrane retains its high salt rejection properties at low-pressure ranges (<100 psi), suggesting a novel rejection mechanism able to operate efficiently at low applied pressure.

Fourier transform infra-red spectra of the treated mesoporous silica samples confirmed modification of the pore surface by the MLD cycles. With increased cycles of MLD, the peak intensities corresponding to the presence of amide bonds increase, indicating continued deposition of polypeptide/amide, in agreement with gas-phase permeance measurements showing decreased pore radius of 2-3 A after 32 cycles.

FIG. 12 shows the FTIR spectra for the mesoporous silica samples treated by APS with various reaction times. We assigned the absorption at 1070 cm$^{-1}$ to the Si—O stretching vibration; the absorption at 3600 cm$^{-1}$ to surface silica —OH groups; and the absorptions at 2800 cm$^{-1}$ and 3300 cm$^{-1}$ to C—H and N—H stretches, respectively. Because the absorptivity of the N—H bond is low, only a small peak is visible at 3300 cm$^{-1}$. The C—H signal at 2800 cm$^{-1}$ can be attributed to the $CH_2$ group in the —$CH_2$—$CH_2$NH ligand, and confirms modification of the pore surface by APS.

Figure 13:
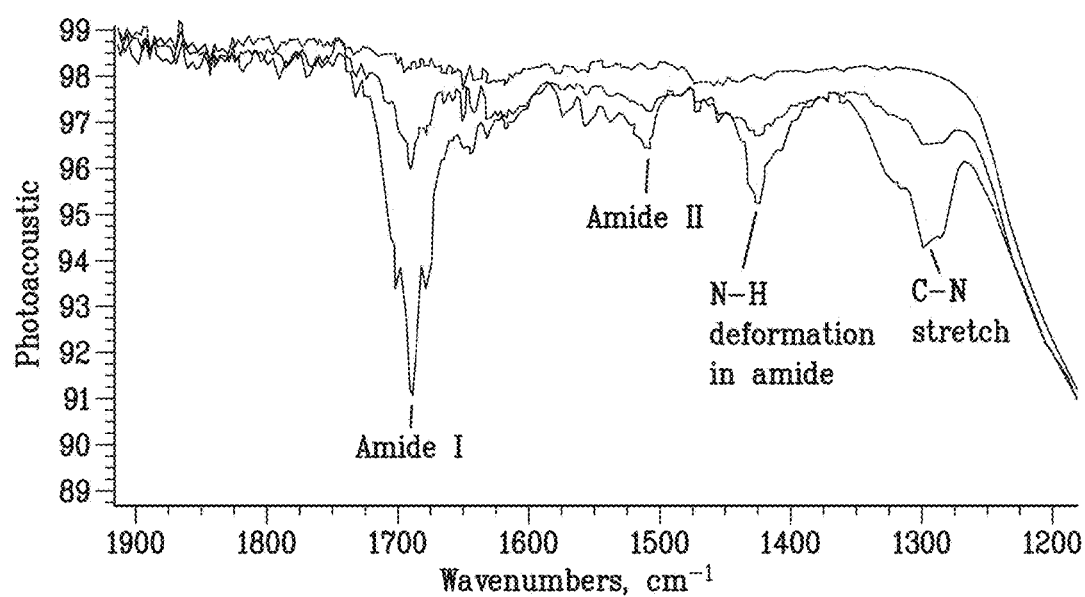
FIG. 13 shows the FTIR spectra for the samples before ALD/MLD modification (top spectrum), after 8 cycles of polypeptide/amide ALD/MLD (middle spectrum) and after 32 cycles of polypeptide/amide ALD/MLD (bottom spectrum).

FIG. 13 shows the FTIR spectra for the samples before MLD modification (the red spectrum), after 8 cycles, polypeptide/amide MLD (the purple spectrum) and after 32 cycles of polypeptide/amide MLD (the blue spectrum). Before MLD, there was no substantial absorption in the range of 1200-1900 cm$^{-1}$. At 8 cycles of MLD, strong signals at 1680 cm$^{-1}$ and 1510 cm$^{-1}$ are present. These are characteristic of amide I bond and amide II bonds, respectively. The adsorption at 1440 cm$^{-1}$ and 1285 cm$^{-1}$ can be attributed to N—H deformation and C—N stretch in amide structure. After 32 cycles of MLD the intensities of all these peaks increase, indicating continued deposition of polypeptide/amide in agreement with our observations of decreased pore radius.

Gas permeance measurements confirmed the presence of a nanoporous structure in a resultant membrane capable of separating small gas molecules (2-3 Å diameter). Spectroscopy measurements confirm mixed hydrophilic (amide)/hydrophobic surface chemistry, similar to the surface chemistry and size of biological filtration channels. In order to probe the progressive pore size reduction by MLD modification, the membrane's permeability to $N_2$ and He was studied.

Figure 14A:
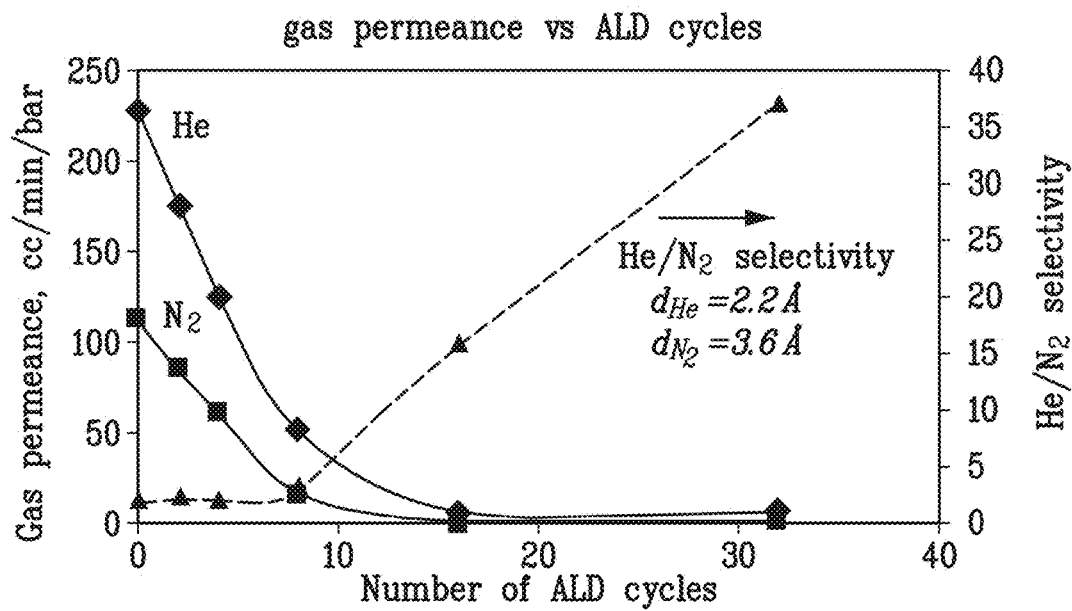
FIG. 14A shows the gas permeance of membranes after various ALD/MLD cycles.

FIG. 14A shows the gas permeance of membranes after various MLD cycles. Prior to MLD, the membrane showed good permeability to both $N_2$ and He, and the He/$N_2$ selectivity was about 2.0. This is in agreement with Knudsen diffusion operating at a pore size of 2.6 nm, much larger than the molecular diameters of both $N_2$ (0.36 nm) and He (0.22 nm). When the number of MLD cycles increases, the permeance of both $N_2$ and He decreases, confirming the progressive pore size reduction. In this range, the permeance is proportional to the square of pore diameter, as predicted by Knudsen diffusion with a cylindrical pore model. After 8 cycles, the He/N$_2$ selectivity becomes greater than 2.6. This suggests that the gas transport mechanism has changed from Knudsen diffusion to configurational diffusion, where the pore size is expected to be about 3-4 times the gas molecular diameter, or 1.0 nm to 1.4 nm. After 16 cycles, N$_2$ permeance tends to zero, indicating that no pores larger than 0.36 nm remain. This implies an MLD deposition rate of about 0.08 Å/cycle or higher if extra cycles were required to close unsealed defects generated during the Brij® 56 templating step. At this moment, the He permeance is still about 6.4 sccm/bar, suggesting that the membrane still has an atomic scale pore size of about 0.22 nm to 0.36 nm, considering a He molecular diameter of 0.22 nm. After 32 cycles, the He/N$_2$ selectivity increased to 36 and He permeance was 4.8 sccm, showing that the membrane retains some porosity with pore diameter between around 0.2 nm to 0.3 nm.

Figure 14B:
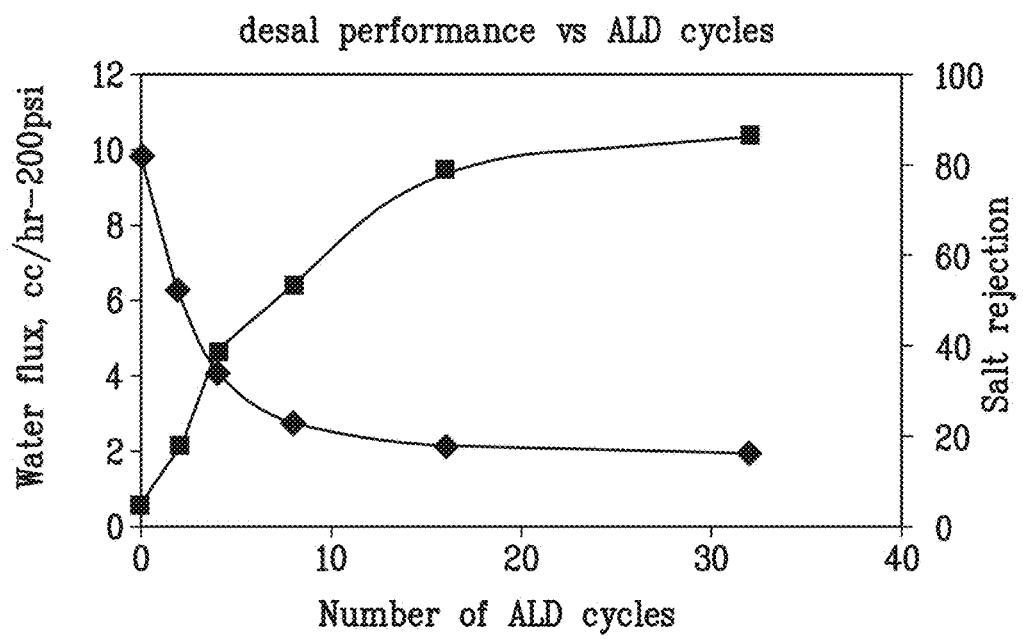
FIG. 14B shows the water flux and salt rejection of the membrane samples described above.

After vapor phase MLD deposition of polypeptide/amide, water permeance and salt rejection properties were measured using an ALLTECH high pressure HPLC water pump, with a constant input feed at 5 g/L NaCl solution and an imposed membrane pressure drop of 200 psi. FIG. 14B shows the water flux and salt rejection of the membrane samples described above. Before MLD modification, the pore size was 2.6 nm and the pore surface was covered by hydroxyl groups. The water flux was 9.8 cc/hr and small salt rejection of 4.7% was observed. After two MLD cycles, the water flux was reduced slightly but the salt rejection increased from 4.7% to 18%, suggesting that the polypeptide/amide surface chemistry has a substantial impact on the salt rejection properties. After 4 MLD cycles, water flux was reduced to 4.1 cc/hr and the salt rejection approached 40%. At this moment the estimated pore size was about 2.0 nm according to gas permeance data. After 8 cycles, the water flux further reduced to 2.8 cc/hr, and the salt rejection increased to 53%, where the estimated pore size was about 1.2 nm. After 16 cycles, water flux was 2.2 cc/hr, and the salt rejection increased substantially to 78%, where the estimated average pore size was about 2-3 Å, but the relatively low He/N2 selectivity of 16 suggests that there may be open defects in the membrane at this point. After 32 cycles, the water flux slightly decreased to 2.0 cc/hr, while the salt rejection increased to 86%. The estimated average pore size was still around 2-3 Å, but the higher He/N2 selectivity indicates a lower defect level. The water flux did not diminish much even though the thickness of the MLD layer doubled. This suggests that after 32 cycles the MLD membrane is thin enough that membrane thickness is not the limiting factor for water transport.

Figure 15:
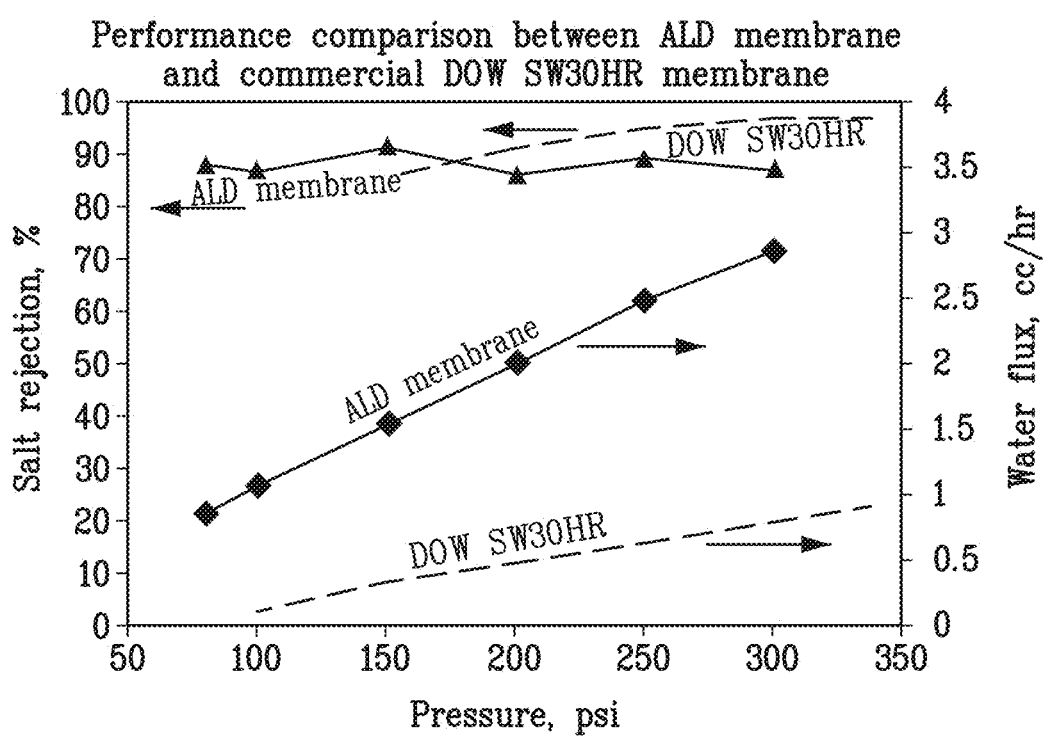
FIG. 15 shows a performance comparison between this ALD/MLD membrane and a sample FILMTEC™ SW30HR membrane tested under the same conditions.

Four more samples were prepared with 32 MLD cycles. The water flux was measured to be 2.00, 2.10, 2.00, and 2.18 cc/hr and the salt rejections were all in the range of 85%-95%. FIG. 15 shows a performance comparison between this MLD membrane and a sample FILMTEC™ SW30HR membrane tested under the same conditions. Compared to thin film composite (TFC) membrane, the MLD membrane has around four times the water flux at 300 psi, and the ratio increases with decreasing pressure. The salt rejection ratio for the MLD membrane is slightly lower than the commercial DOW membrane at the high pressure for which the SW30HR membrane was designed. At 150 psi, the MLD membrane does well in both water flux and salt rejection. In addition, the MLD membrane still retains a linear flux relationship and nearly constant salt rejection with decreasing pressure, making it able to operate highly efficiently as low as 80 psi (at only 26 psi of resistive loss), where it achieves a permeability of I$_P$=3.05 cm/h·bar and 87%-95% salt rejection—for a standard resistance of ε=0.16 bar h/cm.

Water flow and salt rejection ratios were measured for our nanoporous biomimetic polypeptide membrane and the FILMTEC SW30HRLE thin film composite membrane under equivalent conditions for a variety of imposed membrane pressure drops. Results from these measurements are plotted in the graph (FIG. 15) and in Table 1 below, with data points at the 5.5 and 10.3 bar of applied pressure. Note, but not shown, no water flux was observed for the thin-film composite below an applied pressure of 10 bar.

The following considerations were made in constructing the FIG. 15 and Table I. Water flow and salt rejection properties were measured using a high-pressure liquid chromatography (HPLC) water pump, with a constant input feed at 5 g/L NaCl solution, and varied imposed membrane pressure drops. These results are plotted in FIG. 15. Using two sample data points from the measurements, membrane permeability (flow rate per unit of pressure drop) is tabulated in the top part of Table 1. In the lower part of Table 1, permeability is calculated using published data for commercial membranes operating under their optimal conditions of large pressure drops needed for high salt rejection.

TABLE 1

| Membrane | Permeability cm/hr-bar | Salt Rejection % |
|---|---|---|
| ALD/MLD* | 2.42 | 88 |
| ALD/MLD** | 1.18 | 91 |
| DOW SW30HRLE** | 0.21 | 87 |
| DOW SW30HRLE# | 0.11 | 99.8 |
| DOW SW30ULE# | 0.17 | 99.7 |
| TORAY TM800S# | 0.14 | 99.8 |
| NITTO SWC-4014# | 0.13 | 99.4 |

*Measured at 5.5 bar of applied pressure
**Measured at 10.3 bar of applied pressure
Reference data reported on company data sheets for high applied pressure of 55.2 bar To summarize, the advantages of the nanoporous biomimetic membrane design, as shown in FIG. 15 and Table 1, include: a ten-fold improvement in membrane permeability, which reflects a reduction in membrane resistance to flow; high salt rejection maintained independently of driving pressure, which indicates robust pore structure; water flux increases linearly with driving pressure, which also indicates robust pore structure; separate chemical functionality can be implemented in internal pore surfaces, to control desalination performance, and membrane surfaces, to avoid biofouling; projected reduction in excess energy cost due to membrane resistance to flow is 88%, a savings of $1.45 M/yr for a 100 ML/day desalination plant.

An example of a DNA separation membrane is provided below.

EXAMPLE

This example is directed to single-molecule sensors for detection and characterization of DNA, RNA and proteins with synthetic solid-state pores with sub-nanometer resolution. The process is used in the formation of 'kinked' silica nanopores, using evaporation-induced self-assembly, and their further tuning and chemical derivatization using atomic-layer deposition. Compared with 'straight through' proteinaceous nanopores of comparable dimensions, kinked nanopores exhibit up to fivefold reduction in translocation velocity, which has been identified as one of the critical issues in DNA sequencing. Additionally, the present example discloses an efficient two-step approach to create a nanopore array exhibiting nearly perfect selectivity for ssDNA over dsDNA.

The kinked nanopores reduce the translocation velocity up to fivefold compared with comparably sized straight-through pores. Reducing DNA translocation speed during detection is important for polymer identification and sequencing in nanopores. The present example shows that a kinked nanopore array system fabricated by self-assembly can slow down DNA translocation speed through its unique pore morphology alone.

Nanopore-Array Fabrication

Free-standing arrays of silica nanopores spanning circular apertures having approximate 50-100 nm diameter, defined in silicon nitride by focused ion-beam (FIB) lithography, were fabricated by evaporation-induced self-assembly (EISA), employing non-ionic surfactant Brij® 56 as a structure-directing agent. EISA starts with a homogenous alcohol-water solution of hydrophilic silicic acid precursors plus surfactant. Evaporation accompanying dip-, spin- or aerosol coating progressively concentrates the depositing film in non-volatile silica and surfactant components, resulting in self-assembly of micelles and further self-organization into periodic three-dimensional, silica-surfactant mesophases oriented with respect to the substrate and vapor interfaces. Originally developed to coat solid substrates, EISA is used in this example to form free-standing films spanning approximately 50-100 nm diameter pores through spin-coating or aerosol deposition.

Using cationic and non-ionic surfactants and block copolymers, a variety of cubic and bi-continuous thin-film mesophases may be formed (for example, three-dimensional hexagonal $P6_3/mmc$, micellar cubic (face-centered cubic and body-centered cubic, bcc) and bicontinuous cubic (double gyroid and so on). These structures are of interest for membranes because they have the potential to create the three-dimensional pore connectivity needed for transmembrane permeation. In an embodiment, Brij® 56 under acidic conditions may be used to direct the formation of supported cubic nanoporous silica membranes characterized by an Im3m body-centered symmetry and a Barrett-Joyner-Halenda (BJH) pore diameter of approximately 2.6 nm. Here, to achieve thinner films more commensurate with the dimensions of natural membrane systems, the same composition was diluted eightfold in ethanol, yielding the final Si:Brij®56:EtOH:HCl:$H_2O$ molar ratio 1.28:0.07:248:0.09:71. As shown by the transmission electron microscopy (TEM) cross-sectional image shown in FIG. 16A, spin-coating this composition at 1,000 r.p.m. followed by calcination at 400° C. results in highly ordered films only about 30 nm thick. With regard to DNA translocation, thin films are important because: (1) a shorter contour length increases the likelihood that the channel is continuous and spans the membrane; (2) decreased thickness provides a greater field strength within the membrane, thereby imparting greater momentum to the DNA in overcoming the potential of mean force needed to translocate the pore; (3) modification of the pore surface by post-grafting or atomic-layer deposition (ALD) becomes more efficient when the contour length of the channel is shorter.

Grazing-incidence small-angle X-ray scattering (GISAXS) was used to characterize the structure of the periodic thin-film mesophase. In GISAXS, an X-ray beam is incident on a sample at an angle greater than the critical angle of the film but less than that of the substrate (typically about 0.2°), maximizing the scattering volume of the beam within the film. Use of a two-dimensional detector enables collection of both in- and out-of-plane scattering data for comparison of the pattern to a hypothesized nanostructure.

Figure 17A:
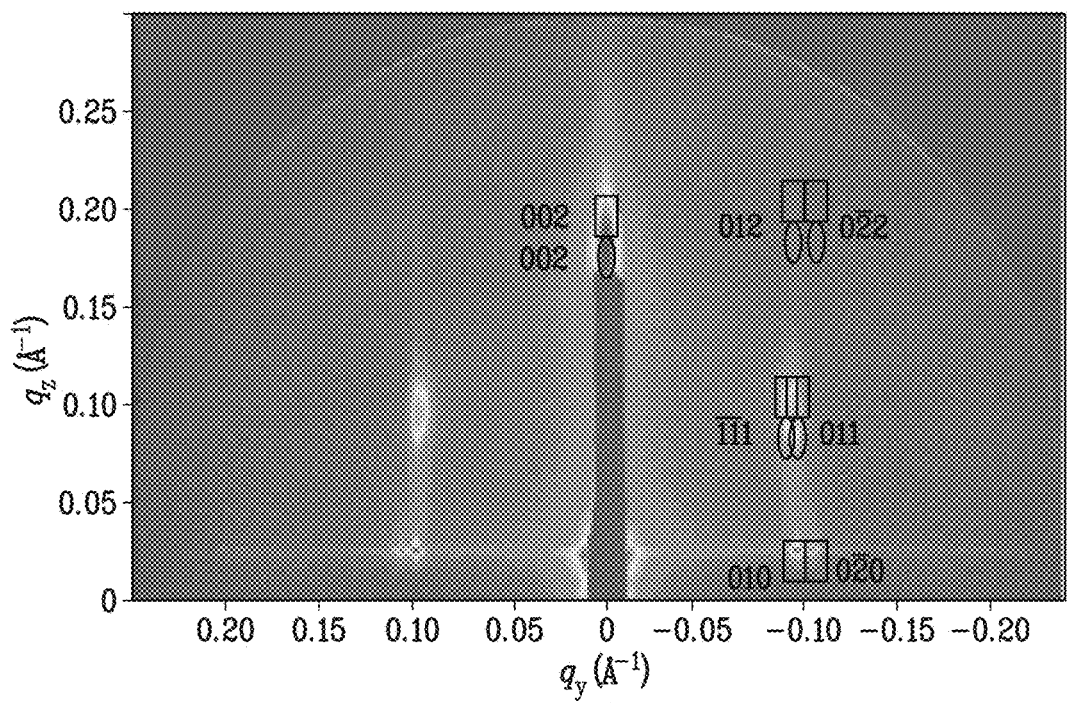
FIG. 17A shows two-dimensional GISAXS data for a self-assembled porous silica film about 30 nm thick.

FIG. 17A shows GISAXS data for an about 30 nm film synthesized in an identical manner to the films used for DNA-translocation experiments. The data is consistent with the presence of two separate but related mesophases: a [001]-oriented face-centered orthorhombic phase with unit-cell parameters a=82 Å, b=122 Å and c=73 Å; this unit cell is an equivalent description of a [110]-oriented Im3m (bcc) phase with a=82 Å, contracted by about 37% in the direction perpendicular to the substrate from uniaxial film shrinkage, and a [001]-oriented three-dimensional hexagonal $P6_3/mmc$ with unit-cell parameters a=b=67 Å and c=73 Å. The in-plane domain size was estimated through line-width analysis to be 200 nm and 125 nm for the Fmmm and $P6_3/mmc$ phases, respectively. These unit-cell parameters, along with typical Brij® 56 micelle dimensions (about 4-5 nm), conform to the existence of micellar-type (as opposed to minimal-surface) bcc and hexagonal close-packed mesophases; we note that these two phases are closely related through a simple diffusionless transformation (GISAXS analysis of a thicker Brij® 56 templated film was also performed). XRD data (FIG. 17B) shows only one set of Bragg peaks (with interplanar spacing d=36 Å), reinforcing the presence of identical interplanar spacing for both structures found inside this film. Also present in the XRD data are Kiessig fringes, from which a film thickness of 28 nm can be calculated (FIG. 17B, inset) for the film after template removal, consistent with TEM and ellipsometric measurements.

FIGS. 17C and 17D contain an illustration of the Fmmm unit cell (c), as well as a schematic of the overall DNA-translocation pathway through the film (d). Although the precise shape and connectivity of pores within the film is not known, a sphere is placed at each lattice point of the Fmmm structure that corresponds to bcc packing to represent the likely positions of pores, and connect these pores in d using the standard eightfold bcc coordination of each lattice point. The shortest pathway through the film, highlighted in red, presents a tortuosity of about 1.5 (the whole pore length divided by film thickness). DNA translocation through other pathways is unlikely, as the electric field is strongest in this direction. Also, pore connectivity of pathways parallel to the plane of the film may be limited owing to larger pore-to-pore spacing. The related hexagonally close-packed structure has the same tortuosity of about 1.5, indicating that DNA passes through an identical pore length through the film thickness in both Fmmm and $P6_3/mmc$ mesophases.

Figure 16A:
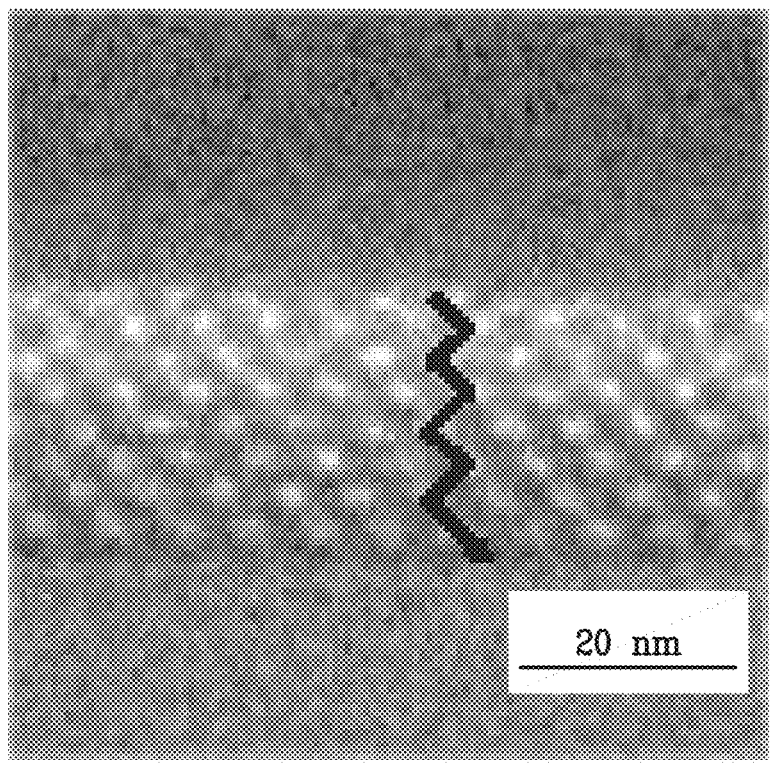
FIG. 16A shows a transmission electron microscopy (TEM) cross-sectional image of an Fmmm mesoporous film according to an embodiment of the present invention.
Figure 16B:
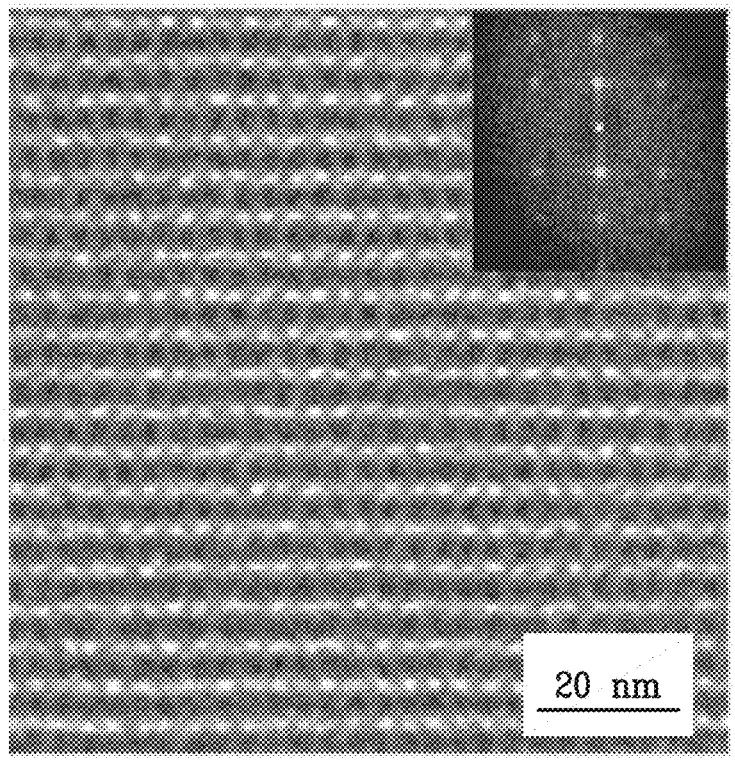
FIG. 16B shows a TEM plan-view image along [001] of the film of FIG. 16A; the insert contains a fast Fourier transform of the bright-field image.
Figure 17B:
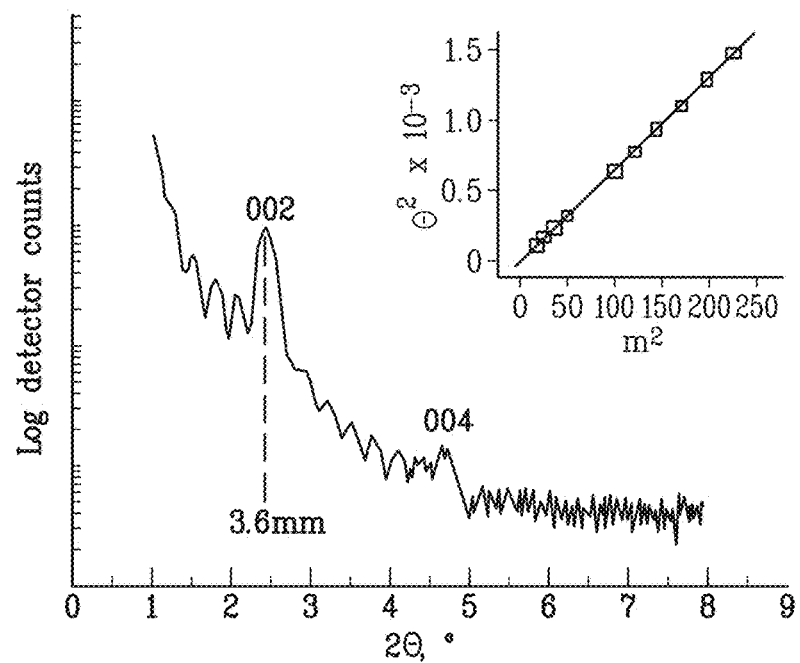
FIG. 17B shows XRD data collected on the same film as used in FIG. 17A; the insert shows the plot of $m^2$ versus $\theta^2$ used to estimate the film thickness, with m being the reflection order and $\theta$ the diffraction angle in degrees.

FIGS. 16A and 16B contain the TEM cross-sectional and plan-view images of a film prepared in an identical manner to the film analyzed in FIGS. 17A-D. The plan view in FIG. 17B shows the (001) plane of the Fmmm structure; the unit-cell parameters a and b calculated from the fast Fourier transform (see the inset) are 8.4 nm and 12.1 nm respectively, consistent with results simulated from GISAXS data. Moreover, the a/b ratio is close to the 1:$\sqrt{2}$ in-plane ratio that is described by the (001) plane of the Fmmm thin-film structure. Consistent with GISAXS analysis, plan-view TEM images of hexagonal (the (001) plane of $P6_3/mmc$) or mixed packing were also observed. The cross-section in FIG. 16A shows the (110) plane of the Fmmm structure, with an overall film thickness of about 30 nm (the most likely tortuous pore pathway through the film is highlighted in black). $N_2$ adsorption, acquired directly on a thin film using a surface acoustic wave technique, shows a typical type IV isotherm; the average BJH pore diameter calculated from these data is 2.6 nm.

Figure 16C:
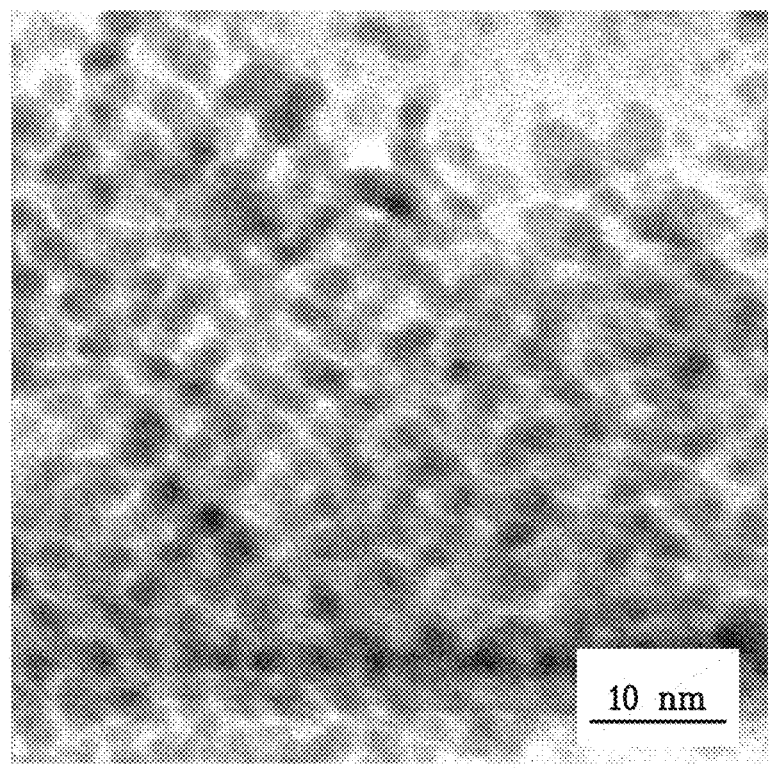
FIG. 16C shows a cross-sectional image along [110] of a Pt replica network after electrochemical deposition of Pt inside the porous film, consistent with the cross-sectional image in FIG. 16A.
Figure 16D:
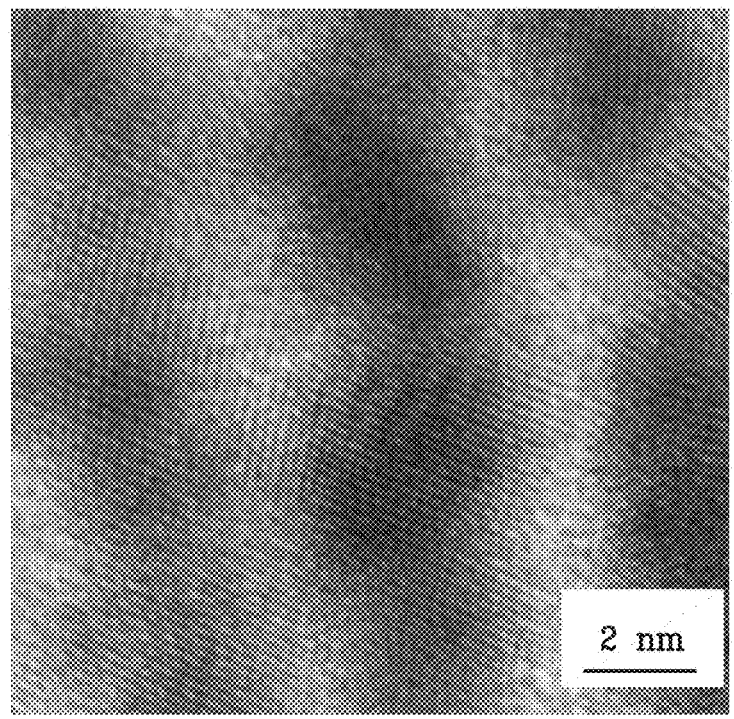
FIG. 16D shows a high-resolution cross-section image of the Pt replica, showing the crystalline structure of the deposited Pt.

Considering the inaccuracy of BJH methods in estimating pore dimensions in such a small pore-size range and the fact that cubic or three-dimensional hexagonal networks derived from micellar mesophases such as those in our ultrathin films are expected to have undulating pore diameters along the pore pathway, an electrochemical approach was used to create a Pt replica of the nanopore network as a means to better estimate pore size and to examine the pore connectivity across the film. FIG. 16C shows a TEM cross-sectional image of the resulting Pt replica formed within the original Fmmm silica framework structure along [110]. The presence of a well-defined Pt network indicates pore connectivity with a tortuous shape for the pore pathway that transverses the film. High-resolution TEM of the Pt replica (FIG. 16D) shows crystalline lattice fringes of Pt with alternating wide and narrow regions corresponding to templated pores and the necking between them, respectively, giving estimated dimensions of about 4 nm for the pore diameter and about 2.6 nm for interpore necks. This suggests that pore-to-pore connectivity provides the transport-limiting barrier to DNA translocation. Therefore, we assign 2.6 nm as the 'effective pore diameter' to refer to the transport-limiting pore dimension. Additionally, the cross-sectional TEM image of the Pt replica in FIG. 16D suggests preferential pore-to-pore connectivity in the through-thickness direction, whereas pore connectivity within the plane is limited.

Figures 18B, 19:
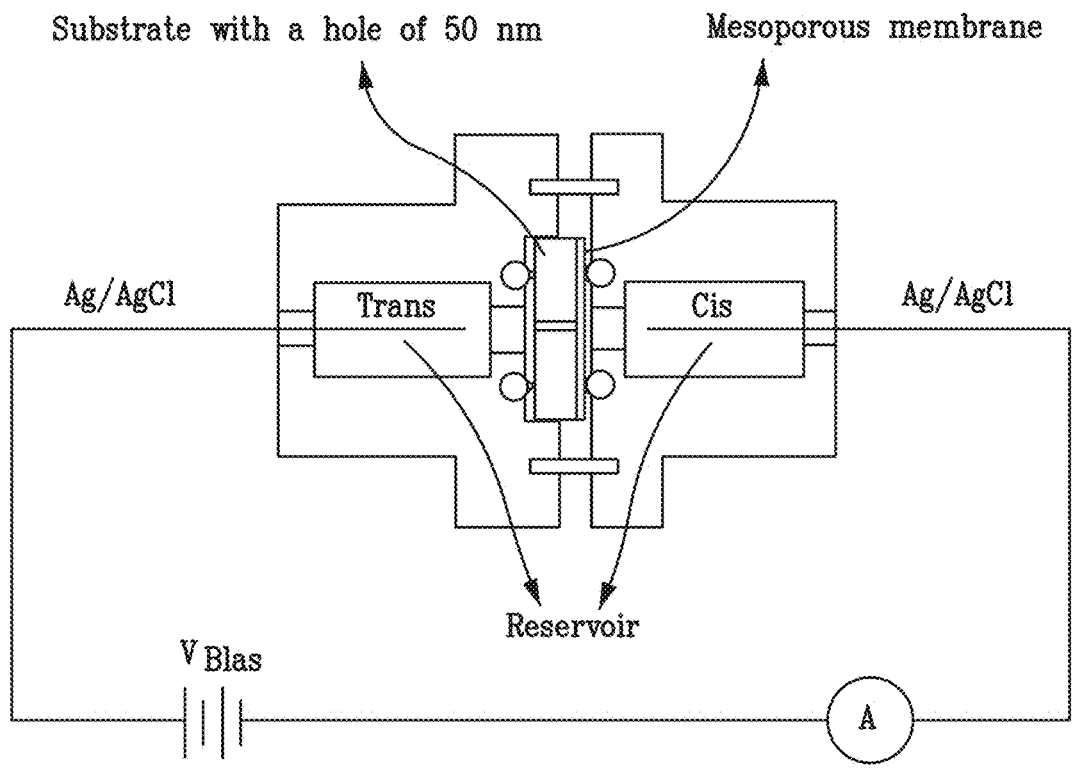
FIG. 18B shows a schematic of the electrochemical cell for carrying out voltage-driven DNA-translocation experiments.
FIG. 19 shows the refractive index, pore volume fraction and $TiO_2$ volume fraction calculated using a Bruggeman effective-medium approximation, and the corresponding thickness of $TiO_2$ and pore-size reduction ($\sigma$) for one and two layers of $TiO_2$ ALD deposition inside a silica nanopore film.

As shown in FIG. 18A, spin-coating exactly the same composition as in FIGS. 16A and 17A, and 2 over an approximate 80 nm diameter aperture (formed in silicon nitride by FIB as shown schematically in FIG. 18A) results in an array of ordered nanopores freely suspended over the aperture. FIG. 18B shows integration of the free-standing nanopore array in a home-built electrochemical cell for carrying out DNA-translocation experiments. As discussed above, our self-assembled nanopores are in a similar size range as those reported in previous studies of DNA translocation. However, the mesophase symmetry of our ultrathin film structure requires that there are no straight-through pores spanning the membrane, allowing us to isolate and understand the influence of nanopore tortuosity on DNA translocation.

Atomic-Layer Deposition (ALD)

To reduce the effective nanopore dimension below 2.6 nm and to modify the pore surface chemistry, thermal ALD of titania or an aminosilane was performed. ALD is a self-limiting, highly conformal, layer-by-layer deposition process composed of two half-cycles, hydrolysis and condensation. For a hydroxylated surface like that of a silica nanopore, condensation is achieved by exposure to a halide or alkoxide precursor, resulting in Si—O-M bond formation and concomitant reduction in the pore diameter. To trigger another layer of deposition, water is introduced to the system, resulting in hydrolysis of surface bonds. FIG. 19 shows refractive-index data measured by spectroscopic ellipsometry for thin nanoporous silica films before and after one and two layers of thermal $TiO_2$ ALD, and the corresponding volume percentage and thickness of $TiO_2$ calculated from this data using a Bruggeman effective-medium approximation (calculated using $n_{SiO_2}$=1.46 and $n_{TiO_2}$n=2.00), in combination with Brunauer-Emmett-Teller film surface areas obtained from $N_2$ adsorption data (290 $m^2$ $g^{-1}$ for the film before ALD, and 286 $m^2$ $g^{-1}$ after one layer of ALD). Although the estimated volume fraction of $TiO_2$ is dependent on the value of the refractive index for $TiO_2$ used in the effective-medium approximation calculations, variation of $n_{TiO_2}$ over the range of 1.90-2.10 (typical for non-crystalline titania) modifies the volume fraction by only about 10%. The calculated thicknesses of 1.7 Å for the first ALD layer and 1.5 Å for the second layer are consistent with the expected thickness per deposition step of about 1.6 Å, indicating that one and two layers of $TiO_2$ ALD deposition inside the silica nanoporous film result in pore-diameter reductions of approximately 3.4 Å and 6.4 Å respectively. Thin film with a 2.6 nm 'effective pore diameter' was determined by the BJH calculation in combination with high-resolution TEM of the Pt replica, the approximate pore diameters after one and two layers of $TiO_2$ ALD are 2.3 nm and 2.0 nm respectively. Also, the BJH pore diameters calculated from the $N_2$ adsorption isotherm before and after one layer of ALD show about 3 Å decrease of pore diameter, which is close to that calculated from the refractive-index data (FIG. 19); although the BJH method can be subject to large errors in the determination of absolute pore size, errors in relative measurements are expected to be significantly lower.

ALD was also used to form a coherent aminopropyl silane monolayer using the molecular precursor aminopropyltrimethoxysilane (APTMS). Successive cycles of APTMS and $H_2O$ favor condensation reactions between alkoxysilane groups on APTMS and silanol groups on the pore surface or between alkoxysilane groups of nearby APTMS, resulting in an aminopropyl silane monolayer as opposed to a multilayer. The Fourier-transform infrared spectrum after one cycle of APTMS/$H_2O$ shows that two new vibrational bands appear, attributable to N—H bending (scissoring) of primary amines (around 1,650 $cm^{-1}$ and C—H stretching of alkyl chains (around 2,900 $cm^{-1}$) respectively, consistent with the formation of an APTMS monolayer.

DNA Translocation

Figure 20A:
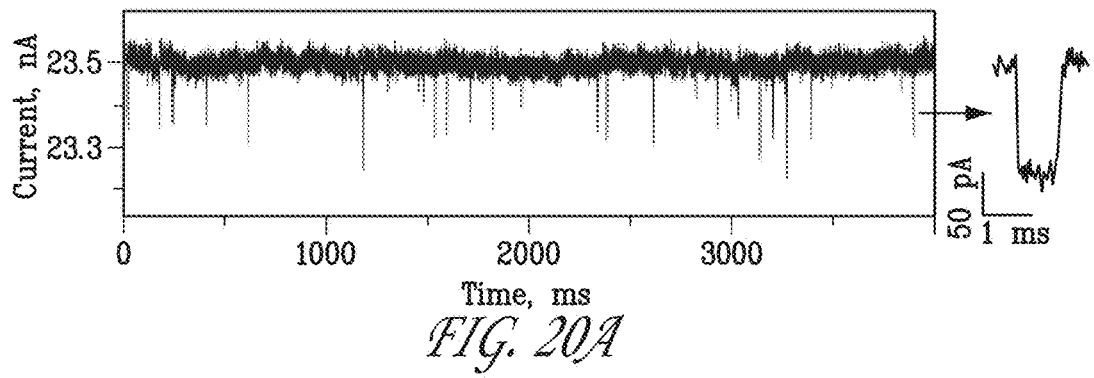
FIG. 20A shows a typical trace of current as a function of time during dsDNA translocation, showing a series of blockages and a magnification of a single current-blockage event.
Figure 20B:
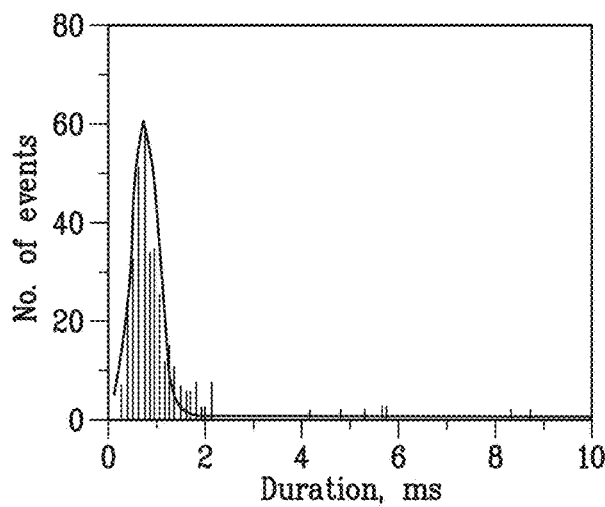
FIG. 20B shows a duration histogram of 2.7-kbp DNA translocation events for a 2.6 nm diameter silica nanopore array.
Figure 20C:
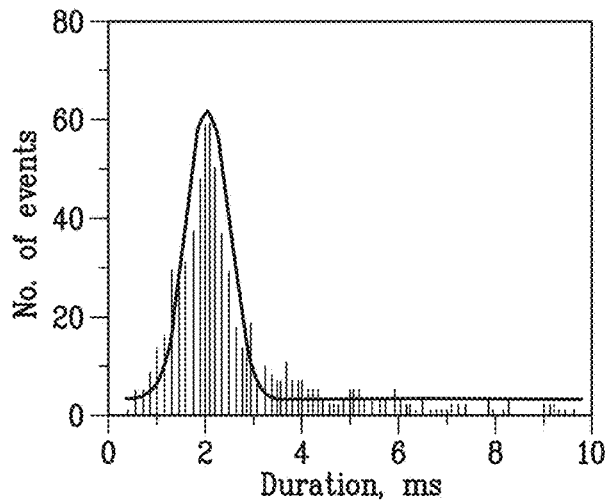
FIG. 20C shows a duration histogram of 2.7-kbp DNA translocation events for the silica nanopore array as in FIG. 20B.
Figure 20D:
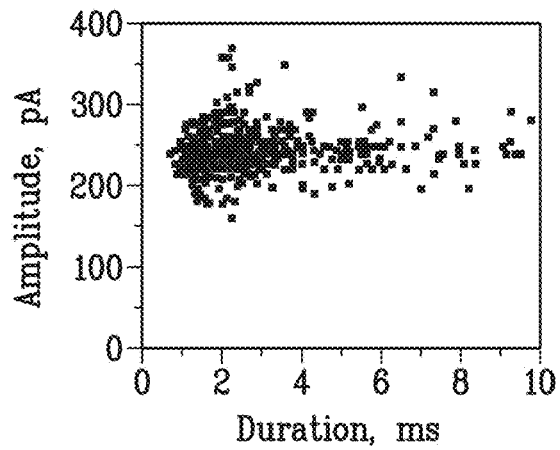
FIG. 20D shows a typical event scattered diagram of amplitude and duration for 560 current-blockage events for the nanopore array after 1 cycle of $TiO_2$ ALD.

A representative ionic-current-versus-time trace for voltage-driven dsDNA translocation through a 2.6-nm-diameter silica nanopore array is shown in FIG. 20A. In this experiment, 2,700-base-pair (2.7-kbp) dsDNA was introduced to the cis side of the cell and a potential of +200 mV was applied to the trans side. A series of current–blockage events is observed. Reversing the voltage bias or replacing dsDNA with blank buffer solution suppressed all current-blockage events, implying that the observed blockages are caused by dsDNA translocation. The background current (~23,000 pA) represents the collective ion current through all the nanopores on the aperture (estimated to be ~80 pores in this case). Correspondingly, it is greater than that of a single-nanopore system and scales with the size of the aperture and number of pores in the array. However, the current-blockage amplitude (200 pA at 200 mV) per event is comparable to that reported previously for single nanopores. Each current blockage represents a single event of one dsDNA molecule passing through an individual pore, and the overall current-blockage frequency is the sum of the dsDNA translocation events on all nanopores supported over the FIBed aperture. Because the translocation time r (<1 ms) is short compared with the event frequency (0.5-1 s/event), the probability of two events coinciding is very rare, implying that in our array dsDNA translocation characteristics of individual pores can still be detected and interpreted as for single-nanopore systems. FIG. 20B shows that the most probable dsDNA translocation time r in 2.6 nm pores is 0.7 ms, corresponding to a velocity of 1.3 mm $s^{-1}$ calculated from v=$L_{DNA}$r, in which $L_{DNA}$ is the polymer length, almost an order of magnitude less than that reported elsewhere using larger solid-state nanopores. One cycle of $TiO_2$ ALD reduces the pore diameter by approximately 0.3 nm (to about 2.3 nm) and further reduces the velocity by about a factor of three (about 0.45 mm $s^{-1}$) (FIG. 20C). This large dependence of velocity on pore size is consistent with a strong polymer-pore interaction (see further discussion below). FIG. 21A shows that the translocation time r scales linearly with polymer length I. If hydrodynamic friction within the pore dominates the transport dynamics, the constant driving force F experienced by the polymer within the pore (F=2 eV/a$_0$, where e is the elementary charge, V is the potential difference and a$_0$ (=0.4 nm) is the spacing between nucleotides) is balanced by the hydrodynamic friction within the pore=$_{ff}$v, where, ignoring an specific DNA-pore interactions $\xi_{eff}$v=$2\pi\eta L_{pore}$rv/R r (where R is the pore radius, r is the dsDNA cross-sectional radius, 0 is the solvent viscosity, $L_{pore}$ is the pore length and v is the linear velocity of the polymer inside the pore). This implies the translocation velocity v to be constant with polymer length, as we observe. Additionally, because ALD deposition is conformal and changes the pore size but not its shape, we can use the force balance to estimate the velocity ratio $v_1/v_2$ in reducing the pore radius from $R_1$ to $R_2$ at a constant driving potential. Reducing 2R from approximately 2.6 to approximately 2.3 nm (FIG. 19) should reduce v by a factor of about two. Experimentally, a factor of three was observed, suggesting additional frictional forces arising from specific polymer-pore interactions or, more likely, the tortuous pore shape defined by the micellar mesophase. A second cycle of TiO$_2$ ALD reduces the pore diameter to 1.9-2.0 nm, below that of dsDNA, and, as expected, we observe no measurable dsDNA translocation (for driving potentials less than 500 mV where we expect there to be no denaturization). A final dynamical feature of our nanopore system is the approximate quadratic relationship between velocity and voltage (FIG. 21B).

The transport characteristics of the kinked-nanopore arrays described above are distinct from those of other solid-state nanopores and more similar to protein nanopores. For example, it has been observe that the translocation time in 10-nm-diameter solid-state nanopores to vary with dsDNA length as a power law, t=I$^{1.27}$ which they attribute to the condition where hydrodynamic drag imposed by the untranslocated polymer on the cis side dominates the friction within the pore. In fact, they conclude that the essential difference between solid-state and protein pores is that, for sufficiently shallow solid-state pores, the effect of friction within the pore is negligible. In comparison, for ssDNA translocation through α-haemolysin the translocation time was found to vary linearly with polymer length, consistent with pore-friction-dominated translocation owing to the small 1.4 nm diameter pores plus possible specific DNA-pore interactions.

To more closely emulate the behavior of protein pores in our solid-state system, we modified the 2.6 nm silica nanopores with APTMS (see the schematic in the inset of FIG. 22A). On the basis of ellipsometric measurements of the thickness of the corresponding film deposited by ALD on a solid silica support, we estimate that one layer of APTMS reduces the pore diameter to about 1.4 nm, comparable to that of α-haemolysin. Additionally, the partial positive surface charge of the aminopropyl groups (NH$_3^+$) introduces an attractive electrostatic DNA-pore interaction, a factor that has been reported to enhance DNA translocation.

For the APTMS-modified nanopore array, no current blockages were observed for 2.7-kbp dsDNA. For pure poly(dA)$_{100}$ current-blockage events were observed, and the corresponding translocation times and current blockages are shown in the histograms in FIG. 22B. When poly(dA)$_{100}$ was added to 2.7-kbp dsDNA, current blockages were again observed and the duration and current-blockage histograms were similar to those of pure poly(dA)$_{100}$. Polymerase chain reaction (PCR) analysis verified dsDNA translocation in the original nanopore array with about 2.6 nm pore diameter, but rejection in the APTMS-modified nanopore array with about 1.4 nm pore diameter; ssDNA translocation was verified in both cases, consistent with the observation of translocation events from current. These results strongly suggest: (1) with APTMS-modified nanopores, separation of ssDNA from dsDNA is achieved and can be sensed electronically; (2) pore-size reduction by ALD occurs uniformly for all pores, allowing selectivity to be developed in an array format. Recently, great effort has been made to distinguish single- and double-stranded nucleic acid molecules using solid-state nanopores. The results, showing nearly perfect selectivity for ssDNA over dsDNA in ALD-modified nanopores, could expand the range of potential applications of synthetic solid-state nanopores in biotechnology by tuning the pore size to be between the diameters of dsDNA and ssDNA.

FIG. 22C shows the velocity of poly(dA)$_{100}$ as a function of applied voltage in the APTMS-modified nanopore array. The velocity was calculated from the blockade-duration half-life r (the time over which the current blockage increases and decreases by 50% of its maximum value) according to $L_{DNA}$/T, which is the appropriate relation for the condition where the polymer length $L_{DNA}$=approx. pore length $L_{pore}$ (film thickness (30 nm)×tortuosity (1.5). An approximate quadratic relationship was observed between velocity and applied voltage similar to that reported for poly(dA) translocation through α-haemolysin. However, direct comparison of the translocation time of poly(dA)$_{100}$ through the APTMS-modified nanopore and α-haemolysin under identical conditions (22° C., 120 mV) shows approximately 5 times longer translocation times (1.6 ms compared with 0.3 ms) and, correspondingly, approximately 5 times lower velocity for the APTMS-modified nanopore. As the pores are of comparable diameters, we attribute this difference to the more tortuous shape of our solid-state nanopore, most likely owing to a higher energy barrier derived from the pore kinkedness. Our transport model further verifies the higher energy barrier in our tortuous nanopores compared with that in straight-through pores and clearly explains the physical characteristics of the parameters used in the simulation, with values that can all be well explained by strong interaction between the polymer and the kinked pores.

The present example shows a simple self-assembly procedure to create a free-standing nanopore array and its further physical and chemical modification by ALD. Compared with lithography or etching, which yield individual, shallow, straight-through nanopores, self-assembly provides a new means to direct the size, shape and tortuosity of an array of solid-state nanopores. Subsequent conformal ALD of an oxide or silane reduces uniformly the diameters of all pores, enabling, for example, the array to be tuned to transport ssDNA efficiently and reject dsDNA. Compared with protein pores of comparable pore diameters, the greater pore length combined with the kinked pore shape, derived from mixed distorted bcc (with Fmmm symmetry) and hexagonally close-packed mesophases, increases the frictional force and reduces the translocation velocity by a factor of up to five. The present example demonstrates how pore size and shape combine to influence translocation and to address the important issue of reducing translocation speed. The qualitative DNA translocation characteristics developed in our nanopore array, for example the linear dependence of translocation time on polymer molecular weight and quadratic dependence of translocation velocity on voltage, can be understood on the basis of a one-dimensional diffusion model, where factors contributing to the frictional force, namely, pore diameter, length, shape and specific interactions, are coalesced into a single barrier potential. The integration of the disclosed kinked-nanopore array into a three-electrode 'chem-FET' architecture, could combine reduced translocation velocities with increased signal-to-noise ratio.

SUMMARY

In summary, the present disclosure presents a membrane that can be tuned to successfully mimic an aquaporin channel. Using the ALD/MLD process described above, uniformly coated membranes having a thin, less than the characteristic 100 nm thickness of traditional desalination membranes, may be formed for a variety of applications and conditions. The membranes have a uniform pore size of a diameter that can be determined by the ALD/MLD process. The pore structure of the membranes is robust, or in other words, does not distort under pressure, in contrast to traditional membranes that lose performance under pressure. The high flux rates achieved show that the majority of pores are functionally active and remain very good water conductors over a wide range of pressure.

This disclosure demonstrates the fabrication of high flux desalination membranes with substantial salt rejection capabilities based on a hybrid inorganic/organic framework. The combination of self-assembled mesoporous silica and subsequent MLD tuning has permitted synthesis of an oriented nanoporous geometry with which it is possible to mimic essential features of natural water channels. That the membranes demonstrated an immediate improvement in salt rejection after 2 MLD cycles shows that the mixed amide/hydrophobic surface chemistry contributes to ion exclusion. Further cycles substantially increase the salt rejection, likely through a combination of narrowing the channel diameter and defect healing. When the average channel size is narrowed to atomic dimensions, 2-3 Å in diameter, 85-95% salt rejection is achieved.

What is claimed is:

1. A method of making a membrane, comprising:
   providing a support comprising at least one pore comprising an initial surface and an initial pore diameter having an initial pore surface chemistry, the at least one pore having a first pore depth;
   activating the initial pore surface chemistry to a second pore depth less than the first pore depth;
   using an atomic layer deposition process or a molecular layer deposition process to deposit a material to reduce the initial pore diameter to form a reduced pore diameter having a surface up to the second pore depth;
   activating the surface of the deposited material up to the second pore depth; and
   depositing a porous material into the reduced pore diameter to form a porous passage through the at least one pore.

2. The method of claim 1, wherein the atomic layer deposition process or the molecular layer deposition process comprises using two or more reactants to form the material, and wherein the two or more reactants are sequentially introduced and followed by a purge or rinse step to remove unreacted reactants and reaction byproducts.

3. The method of claim 1, wherein the porous material is a polymer.

4. The method of claim 1, wherein the material is an oxide.

5. The method of claim 1, wherein the material is deposited to a pore depth of less than 100 nm.

6. The method of claim 1, wherein the material is deposited to a pore depth of less than 10 nm.

7. A method of making a membrane, comprising:
   providing a support comprising at least one pore having an inside pore surface comprising a surface chemistry, the at least one pore having a first pore depth;
   using an atomic layer deposition process or a molecular layer deposition process to modify a portion of the inside pore surface with an alternate surface chemistry up to a second pore depth less than the first pore depth;
   modifying the alternative surface chemistry to a second pore depth less than the first pore depth; and
   depositing a porous material into the reduced pore diameter to form a porous passage through the at least one pore.

8. The method of claim 7, wherein the portion of the inside surface extends 100 nm or less from the pore opening.

9. The method of claim 7, wherein the alternate surface chemistry is selected from a group consisting of hydroxyl, amines, carboxyls, sulfonates, thiols, polymers, proteins, polyamides, polypeptides, natural peptides and synthetic peptides.

10. The method of claim 3, further comprising:
    carbonizing the polymer to form a carbon structure having a surface chemistry.

11. The method of claim 10, further comprising:
    modifying the surface chemistry of the carbon structure.

* * * * *